US008754712B2

(12) United States Patent  (10) Patent No.: US 8,754,712 B2
Seebacher et al.  (45) Date of Patent: Jun. 17, 2014

(54) SYSTEM AND METHOD FOR A CASCODED AMPLIFIER

(75) Inventors: David Seebacher, Villach (AT); Peter Singerl, Villach (AT); Christian Schuberth, Villach-Landskron (AT); Martin Mataln, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 13/538,309

(22) Filed: Jun. 29, 2012

(65) Prior Publication Data

US 2014/0002192 A1   Jan. 2, 2014

(51) Int. Cl.
*H03F 1/22*   (2006.01)
(52) U.S. Cl.
USPC .......................................................... 330/311
(58) Field of Classification Search
USPC ........................................... 330/51, 295, 311
See application file for complete search history.

(56) References Cited

U.S. PATENT DOCUMENTS

| | | | |
|---|---|---|---|
| 5,729,175 A | 3/1998 | Ferrer | |
| 7,187,239 B2* | 3/2007 | Yeh ................................. | 330/295 |
| 7,236,055 B2* | 6/2007 | Halbert et al. ................ | 330/256 |
| 8,058,927 B2 | 11/2011 | Potscher et al. | |
| 2004/0263245 A1 | 12/2004 | Winter et al. | |
| 2009/0270056 A1 | 10/2009 | Singerl et al. | |
| 2010/0054325 A1 | 3/2010 | Sjostrom | |

OTHER PUBLICATIONS

Chi, S., et al., "The Frequency Spectrum of Polar Modulated PWM Signals and the Image Problem," ICECS, 2010, pp. 679-682, IEEE.
Amin, A.M.A., et al., "Exploring Aliasing Distortion Effects on Regularly-Sampled PWM Signals," 3$^{rd}$ IEEE Conference on Industrial Electronics and Applications, Jun. 3-5, 2008, pp. 2036-2041, Singapore.
Song, Z., et al., "The Frequency Spectrum of Pulse Width Modulated Signals," Jun. 2, 2003, pp. 1-39.
Guinee, R.A., "A Novel Fourier Series Simulation Tool for Pulsewidth Modulation (PWM) in Pulsed Power Systems," Conference Proceedings Applied Power Electronics Conference and Exposition, Feb. 15-19, 1998, pp. 123-128, vol. 1, Cork, Ireland.
Gustavsson, U., et al., "A General Method for Passband Quantization Noise Suppression in Pulsed Transmitter Architectures," IMS 2009, pp. 1529-1532, Stockholm, Sweden.
Santi, S., et al., "Spectral Aliasing Effects of PWM Signals with Time-Quantized Switching Instants," Proceedings of the 2004 International Symposium on Circuits and Systems, May 23-26, 2004, pp. IV-689-IV-692.
Wilkinson, Ernest J., "An N-Way Hybrid Power Divider," IRE Transactions on Microwave Theory and Techniques, pp. 116-118, Jun. 1959.

(Continued)

*Primary Examiner* — Steven J Mottola
(74) *Attorney, Agent, or Firm* — Slater & Matsil, L.L.P.

(57) ABSTRACT

In accordance with an embodiment, a system includes a first transistor and a second transistor. The first transistor has a first input node coupled to a first signal input, a first output node coupled to a first common node, and a first reference node coupled to a first reference voltage, and the second transistor has a second input node coupled to second signal input, a second output node coupled to an output of the system, and a second reference node coupled to the first common node. The system further includes a first switch switchably coupling the first common node to a second reference voltage.

22 Claims, 23 Drawing Sheets

(56) References Cited

OTHER PUBLICATIONS

Kimball, Donald F., et al., "High-Efficiency Envelope-Tracking W-CDMA Base-Station Amplifier Using GaN HFETs," IEEE Transactions on Microwave Theory and Techniques, vol. 54, No. 11, Nov. 2006, 9 pages.

Lee, Yong-Sub et al., "A High-Efficiency Class-E GaN HEMT Power Amplifier for WCDMA Applications," IEEE Microwave and Wireless Components Letters, vol. 17, No. 8, Aug. 2007, 3 pages.

Xu, Hongtao, et al., "A High-Efficiency Class-E GaN HEMT Power Amplifier at 1.9 GHz," IEEE Microwave and Wireless Components Letters, vol. 16, No. 1, Jan. 2006, 3 pages.

Gwe, B-H., et al., "A Micropower Low-Distortion Digital Class-D Amplifier Based on an Algorithmic Pulsewidth Modulator," IEEE Transactions on Circuits and Systems, Oct. 2005, pp. 2007-2022, vol. 52, No. 10.

Agrawal, V., et al., "Mutually Disjoint Signals and Probability Calculation in Digital Circuits," IEEE Proceedings of the 8th Great Lakes Symposium on VLSI, pp. 307-312, Feb. 19-21, 1998.

* cited by examiner

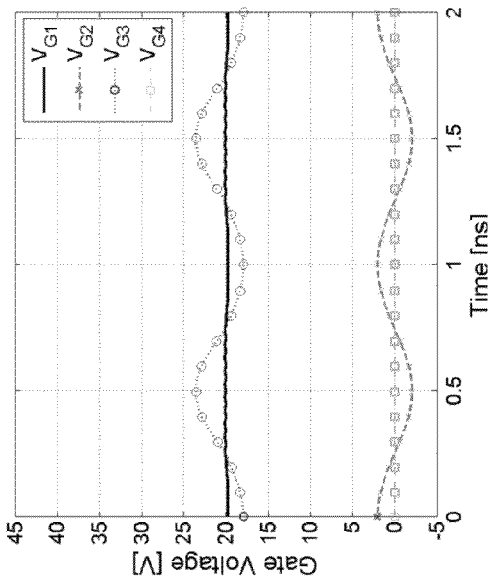
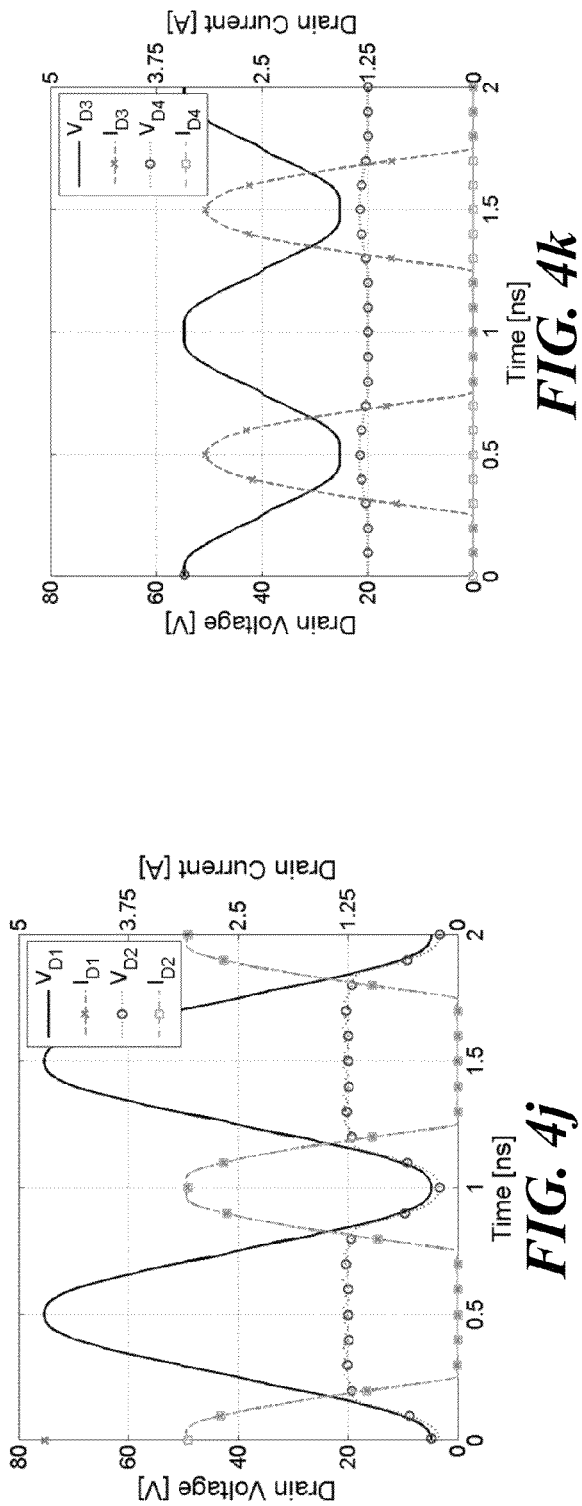
FIG. 4i
FIG. 4j
FIG. 4k

SYSTEM AND METHOD FOR A CASCODED AMPLIFIER

TECHNICAL FIELD

This invention relates generally to semiconductor circuits and methods, and more particularly to a system and method for a cascoded amplifier.

BACKGROUND

As low-power mobile communication systems have become more common, there has been increased market pressure to reduce power in both mobile stations and in base stations. Such a reduction in power not only allows for lower energy costs, but also allows for lower cost and compact circuit implementations that are more compact. As the power consumption of transmission equipment is reduced, there is a corresponding reduction in the need for cooling equipment and for electronic components that are performance rated for high temperature operation. Moreover, lower power equipment is often physically smaller than their higher power consuming counterparts are.

In a radio frequency (RF) transmission system, one of the primary power consumers is the RF power amplifier. In some systems, a power efficient signaling scheme is used to increase the efficiency of the systems. For example, the constant envelope Gaussian Minimum Shift Keying (GMSK) used in GSM systems is very efficient because the power amplifier may be operated closer to compression, and/or because the GSM signaling scheme lends itself toward the use of highly efficient power amplifiers, such as Class E amplifiers.

As the need for high data bandwidths are increasing, however, more systems, such as LTE and WiMAX are utilizing signaling schemes that have high peak to average power ratios (PAPR). While these high PAPR signaling schemes are highly bandwidth efficient, they generally consume more power than some power efficient signaling schemes because the power amplifier that transmit signals with high PAPR are operated in a less efficient back-off condition.

SUMMARY OF THE INVENTION

In accordance with an embodiment, a system includes a first transistor and a second transistor. The first transistor has a first input node coupled to a first signal input, a first output node coupled to a first common node, and a first reference node coupled to a first reference voltage, and the second transistor has a second input node coupled to second signal input, a second output node coupled to an output of the system, and a second reference node coupled to the first common node. The system further includes a first switch switchably coupling the first common node to a second reference voltage.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 4a illustrates an embodiment circuit arranged in a push-pull configuration and FIGS. 4b, 4c, 4d, 4e, 4f, 4g, 4h, 4i, 4j, 4k, 4l, 4m, 4n and 4o illustrate associated waveform graphs;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely cascoded output stage for use with baseband and RF transmission systems. The invention may also be applied, however, to other types of circuits and systems, such as audio systems, communication systems, and other electronic or optical systems.

In an embodiment, high efficiency is maintained in a cascode amplifier by applying a signal to a common source amplifier up to a threshold output signal level, and applying the signal to the cascode transistor while disabling the common source amplifier for output signal levels about the threshold output signal level.

Figure 1A:
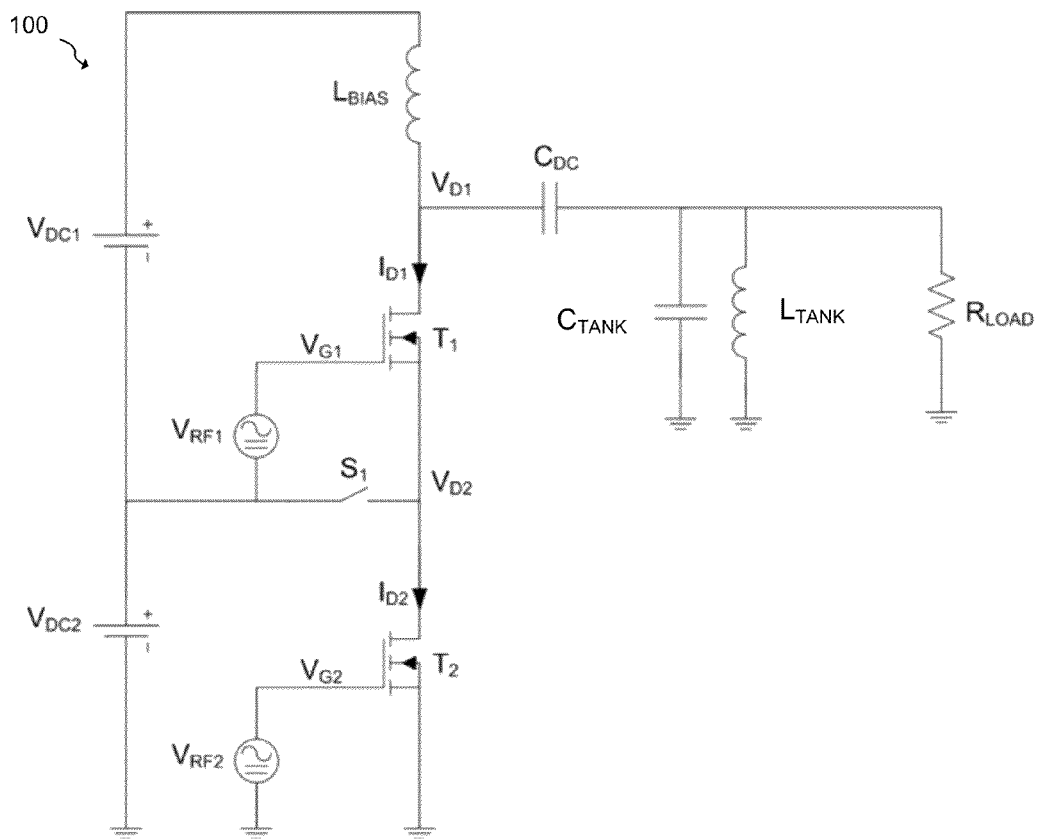
FIG. 1a illustrates an embodiment circuit and FIGS. 1b, 1c, 1d, 1e and 1f illustrate associated waveform graphs.

FIG. 1a illustrates amplifier 100 according to an embodiment of the present invention. Amplifier 100 has input transistor T2 coupled to RF input source $V_{RF2}$, which also provides DC biasing with respect to ground, and cascode transistor $T_1$ coupled to transistor $T_2$ in a cascode configuration. The gate of transistor $T_1$ is coupled to RF input source $V_{RF1}$, which also provides DC biasing with respect to the DC supply voltage $V_{DC2}$. Switch $S_1$ is coupled between the drain of transistor $T_2$ and the DC supply voltage $V_{DC2}$. In an embodiment, $V_{RF1}$ provides an RF signal while $V_{RF2}$ does not provide an RF signal, or $V_{RF2}$ provides an RF signal while $V_{RF1}$ does not provide an RF signal. In some embodiments, $V_{RF1}$ may also provide an RF signal while $V_{RF2}$ provides the RF signal (i.e., $T_1$ continues to receive the RF signal even when $T_2$ is active). When $V_{RF1}$ is active, switch $S_1$ is closed.

In some of the illustrated embodiments, transistors $T_1$ and $T_2$ may have a threshold voltage of 0 V in order to not require an explicit biasing network and enable easier understanding of the illustrated embodiments and their waveforms. However, in alternative embodiments, additional DC bias networks may be used to bias the gates of $T_1$ and $T_2$. The drain of transistor $T_1$ is biased by bias inductor $L_{BIAS}$ and coupled to load $R_{LOAD}$ via DC blocking capacitor $C_{DC}$ and parallel resonant tank formed by capacitor $C_{TANK}$ in parallel with $L_{TANK}$, thereby allowing for class B operation of the amplifier having an efficiency of about 70%. In further embodiments, amplifier 100 may be operated as a class F amplifier or a class J amplifier for enhanced efficiency.

In a first mode of operation, switch $S_1$ is open, a DC voltage is applied to the gate of transistor $T_1$, and the RF voltage source $V_{RF1}$ is not in operation and provides a DC connection for supply voltage $V_{DC2}$. RF voltage $V_{RF2}$ is applied to the gate of transistor $T_2$ and $V_{G1}$ remains constant thereby resulting in class B operation. The corresponding class B efficiency curve can be seen in trace 110 shown in FIG. 1b. It should be noted that the first mode of operation is similar to a conventional class B cascode amplifier. The RF signal for the gate of the cascode transistor T1 may be applied using a transformer or a regular biasing network to shift the DC level to the requisite level needed by transistor T1. In some embodiments, such as embodiments that apply an RF signal to the gate of T1 using a transformer, RF signal may be continually applied during the first mode of operation.

In a second mode of operation, switch $S_1$ is closed, and RF signal source $V_{RF1}$ is activated (if it is not already active) and applied to the gate of transistor $T_1$. RF signal source $V_{RF2}$, on the other hand, is deactivated, meaning no RF signal is applied to the gate of transistor $T_2$. As the DC bias voltage is set to about the threshold voltage to bias the device for class B operation, only a small drain current flows under DC conditions when no RF signal is applied to the gate. This means when the switch $S_1$ is closed and $V_{RF2}$ is deactivated, transistor $T_2$ is inactive and does not consume power. Other biasing conditions besides class B may be accomplished by modulating the DC bias. In the second mode of operation, transistor $T_1$ operates as a common source amplifier. In an embodiment, $V_{DC2}$ is about 20V, and $V_{DC1}$ is about 20V. Alternatively, other DC bias voltages may be used.

Figure 1B:
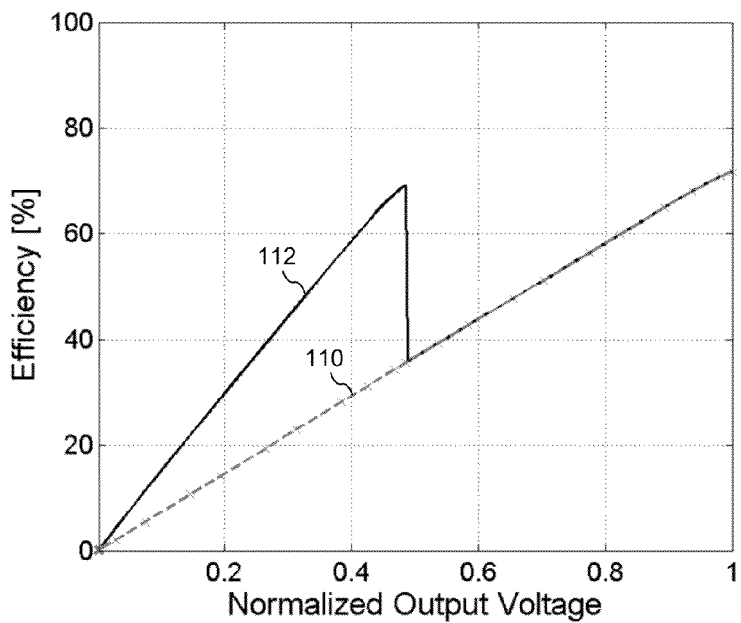

FIG. 1b illustrates a graph that illustrates the efficiency of amplifier 100 with respect to normalized output voltage. Trace 110 illustrates the efficiency of a system using amplifier 100 exclusively in the first (cascoded) mode of operation; and trace 112 illustrates the efficiency of system using amplifier 100 in the second (common source) mode of operation up to about a normalized output voltage of 50%, and in the first (cascode) mode of operation from a normalized output voltage of about 50% to 100%. For normalized output voltages above 50%, assuming equal supply voltages $V_{DC1}$ and $V_{DC2}$, the efficiencies of the two mode system and the cascode mode system (in which switch S1 is open) is about the same.

For normalized output voltages below 50%, the drain voltage of transistor $T_2$ remains approximately constant around the value of $V_{DC2}$ in the cascode (first) mode of operation. This is because the voltage swing at the drain of transistor $T_1$ is not large enough to drive $T_1$ into saturation. Thus, power is dissipated across transistor $T_1$, which leads to a reduction of efficiency. By closing switch $S_1$ and applying the RF signal $V_{RF1}$ only to the gate of $T_1$, transistor $T_2$ is disabled, and thus power dissipation within the amplifier may be minimized and higher efficiency is achieved. In some embodiments, transistor $T_2$ is completely disabled and thus does not draw power from $V_{DC2}$.

Figure 1C:
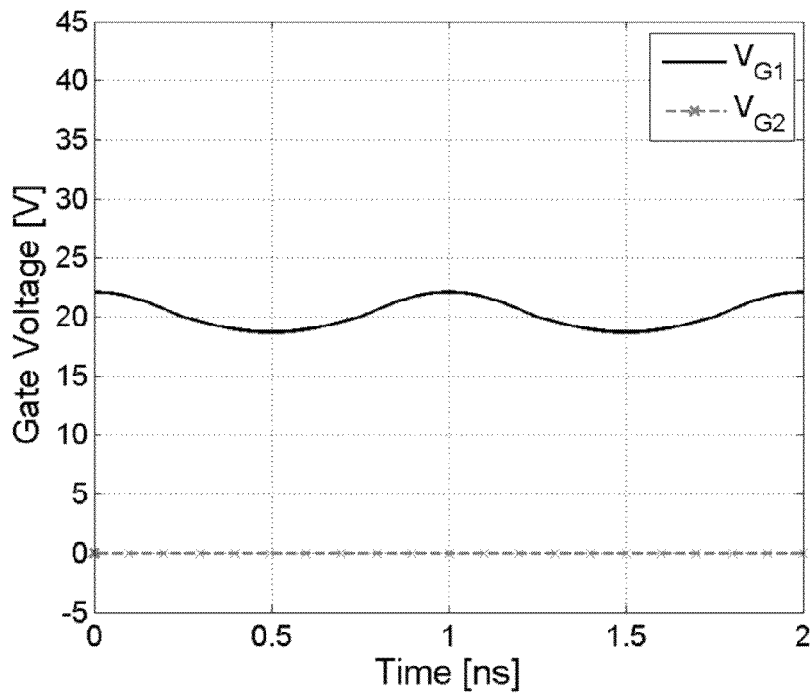
Figure 1D:
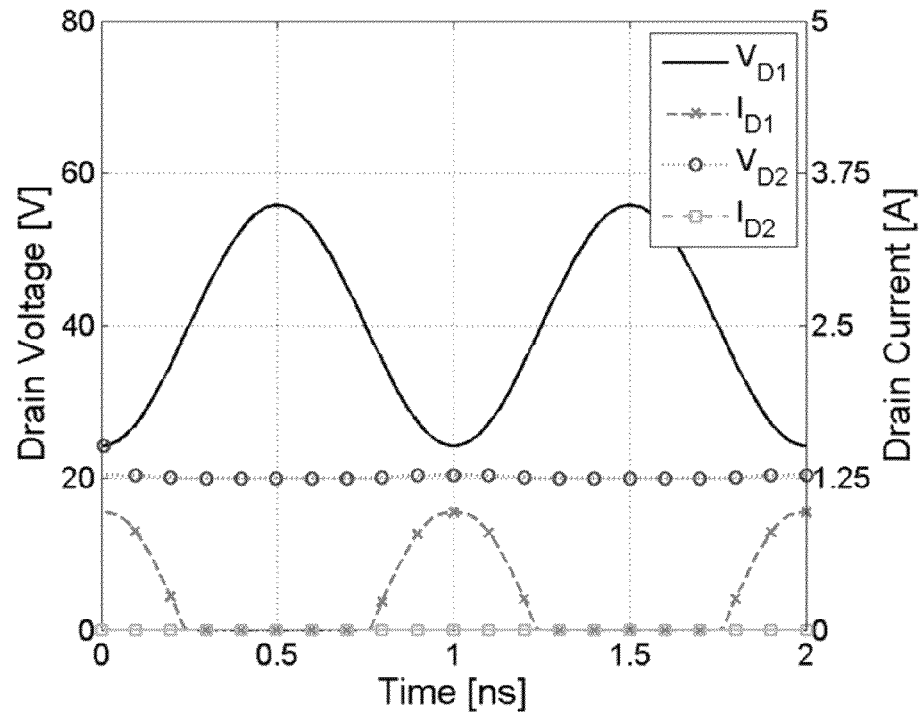

FIG. 1c illustrates the gate voltages of transistors $T_1$ and $T_2$ with respect to time for the second mode of operation in which switch $S_1$ is closed. Here it can be seen that gate voltage $V_{G1}$ of transistor $T_1$ is driven with an RF signal, and gate voltage $V_{G2}$ of transistor $T_2$ is grounded. FIG. 1d illustrates the drain voltages and currents of transistors $T_1$ and $T_2$ with respect to time for the second mode of operation. Here it can be seen that drain current $I_{D1}$ of transistor $T_1$ is active for less than a half-cycle, signifying class B operation, and the drain current $I_{D2}$ of transistor $T_2$ is zero. The output voltage swing $V_{D1}$ is shown to be less than 50% of the maximum output voltage swing.

Figure 1E:
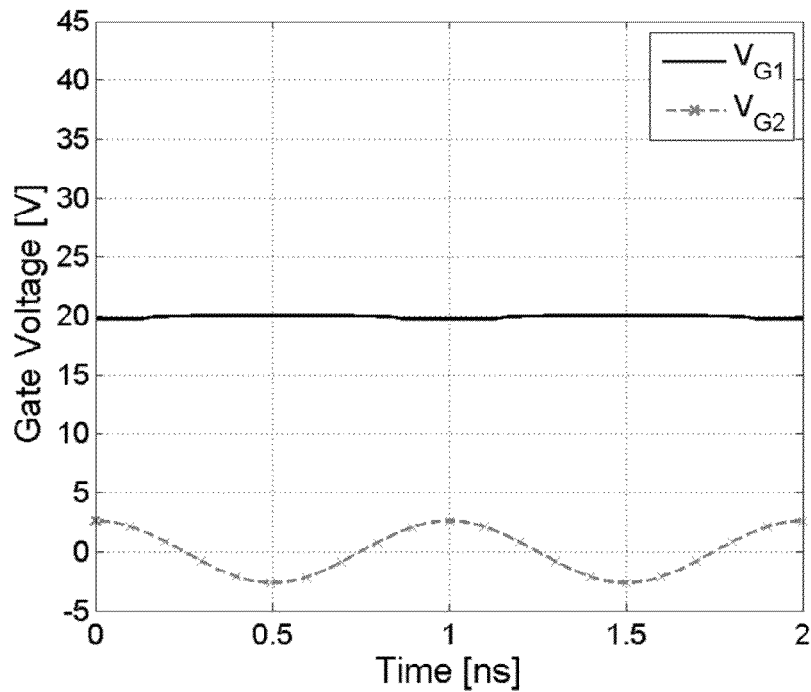
Figure 1F:
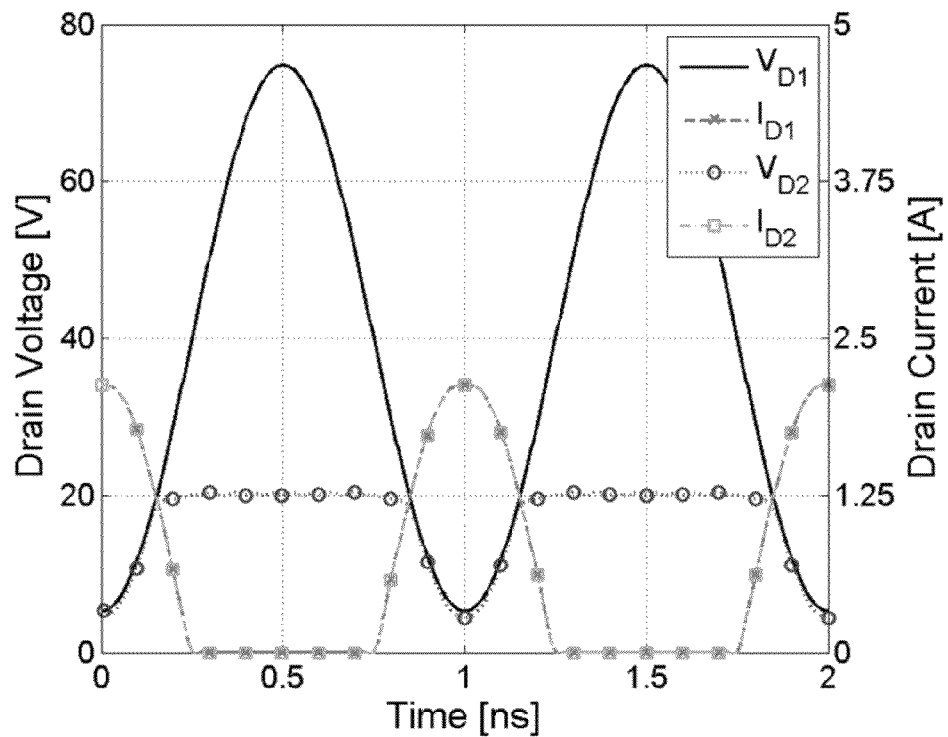

FIG. 1e illustrates the gate voltages of transistors $T_1$ and $T_2$ with respect to time for the first mode of operation in which switch $S_1$ is open. Here it can be seen that gate voltage $V_{G1}$ of transistor $T_1$ is driven with a DC voltage of about 20 V, and gate voltage $V_{G2}$ of transistor $T_2$ is driven with an RF signal. FIG. 1f illustrates the drain voltages and currents of transistors $T_1$ and $T_2$ with respect to time for the first mode of operation. Here it can be seen that drain currents $I_{D1}$ and $I_{D2}$ of both transistors $T_1$ and $T_2$ are active for less than a half-cycle, signifying class B operation. The output voltage swing $V_{D1}$ is shown to be greater than 50% of the maximum output voltage swing.

Figure 2A:
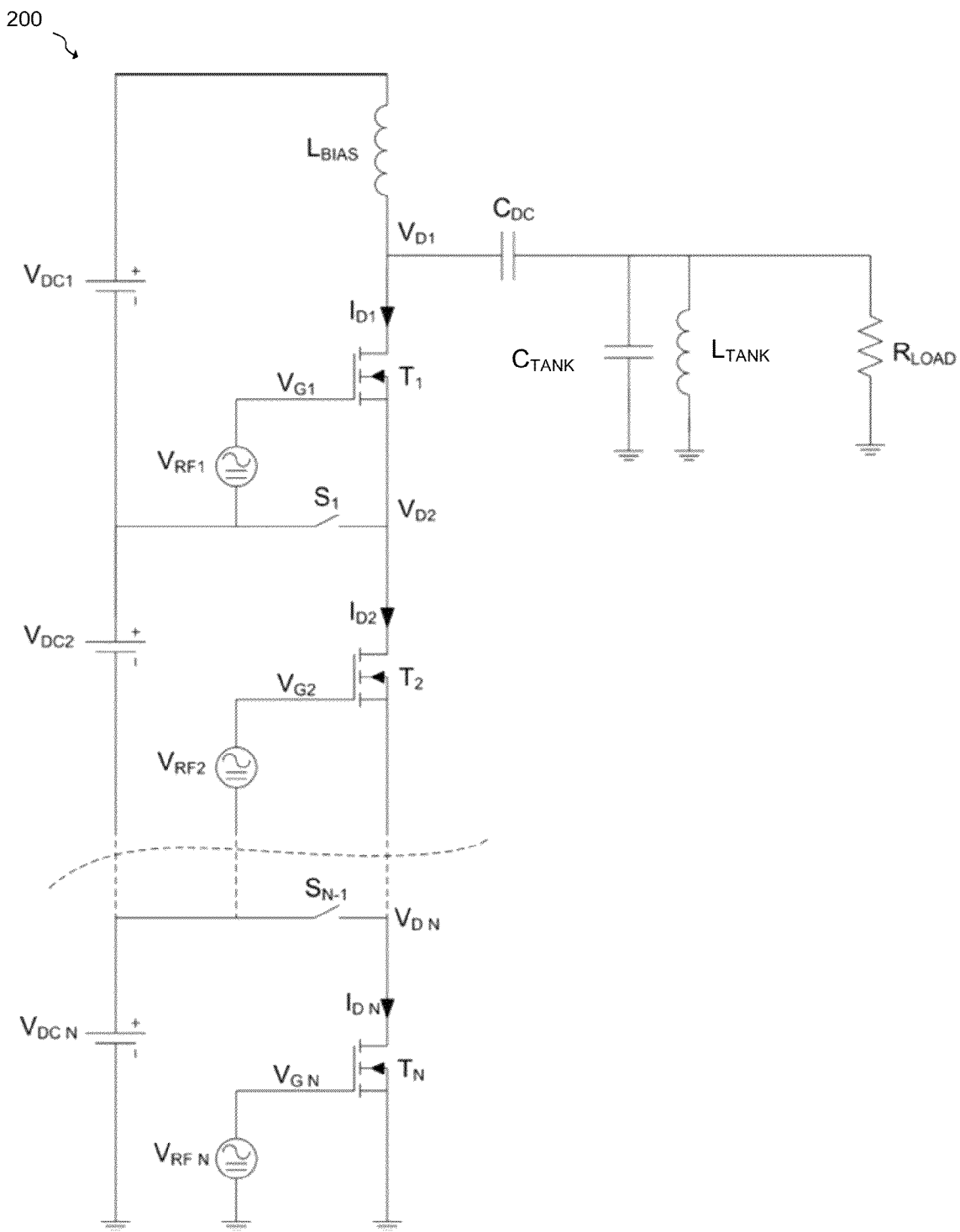
FIG. 2a illustrates an embodiment circuit having N stages and FIG. 2b illustrates an associated efficiency graph.

In accordance with a further embodiment, embodiment amplifier 100 illustrated in FIG. 1a may be extended to have an N-levels, as shown in FIG. 2a with respect to amplifier 200. In an embodiment, amplifier 200 has an additional transistors stacked in series below transistors $T_1$ and $T_2$, as represented by transistor $T_N$, additional power supplies stacked in series below DC supplies $V_{DC1}$ and $V_{DC2}$, as represented by $V_{DCN}$, and additional switchable RF signal sources coupled to the gates of each respective transistor as represented by $V_{RFN}$ coupled to the gate of transistor $T_N$, for a total of N transistors, N power supplies, and N RF signal sources. In addition, additional switches are coupled between the source and the gates of the stacked transistors as represented by switch $S_{N-1}$. In an embodiment, only the stages needed to produce an output signal with a certain voltage swing are in operation at the same time. For example, in one embodiment, only one of the N RF signal sources may be active at a particular time.

Figure 2B:
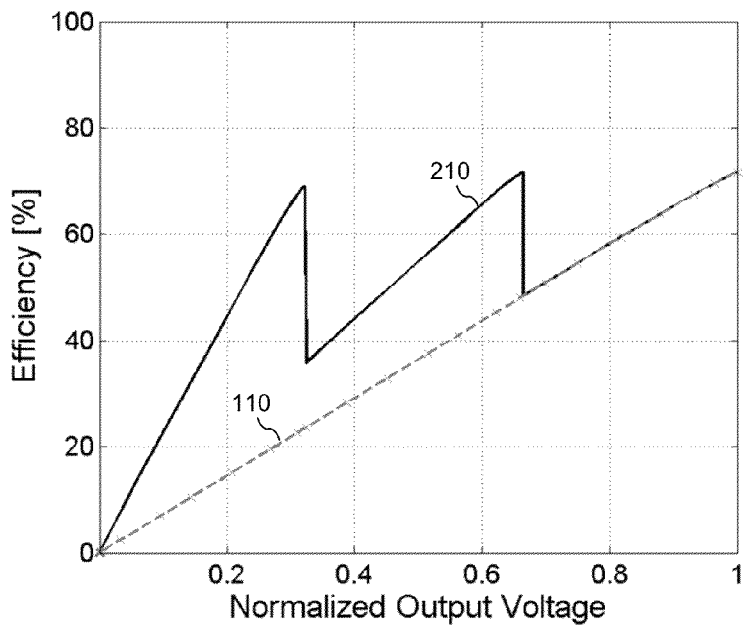

FIG. 2b illustrates an efficiency curve 210 of amplifier 200 where N=3 compared to the efficiency of a cascoded amplifier as represented by efficiency curve 110. As shown, efficiency curve 210 has as many peaks as there are amplification levels. In an embodiment, supply voltages $V_{DC1}$ though $V_{DCN}$ may differ from each other and may be set in a way that increases or optimizes the overall efficiency of the system. It can be seen the more levels are available, the better the efficiency curve and higher the potential average efficiency gets.

Figure 3A:
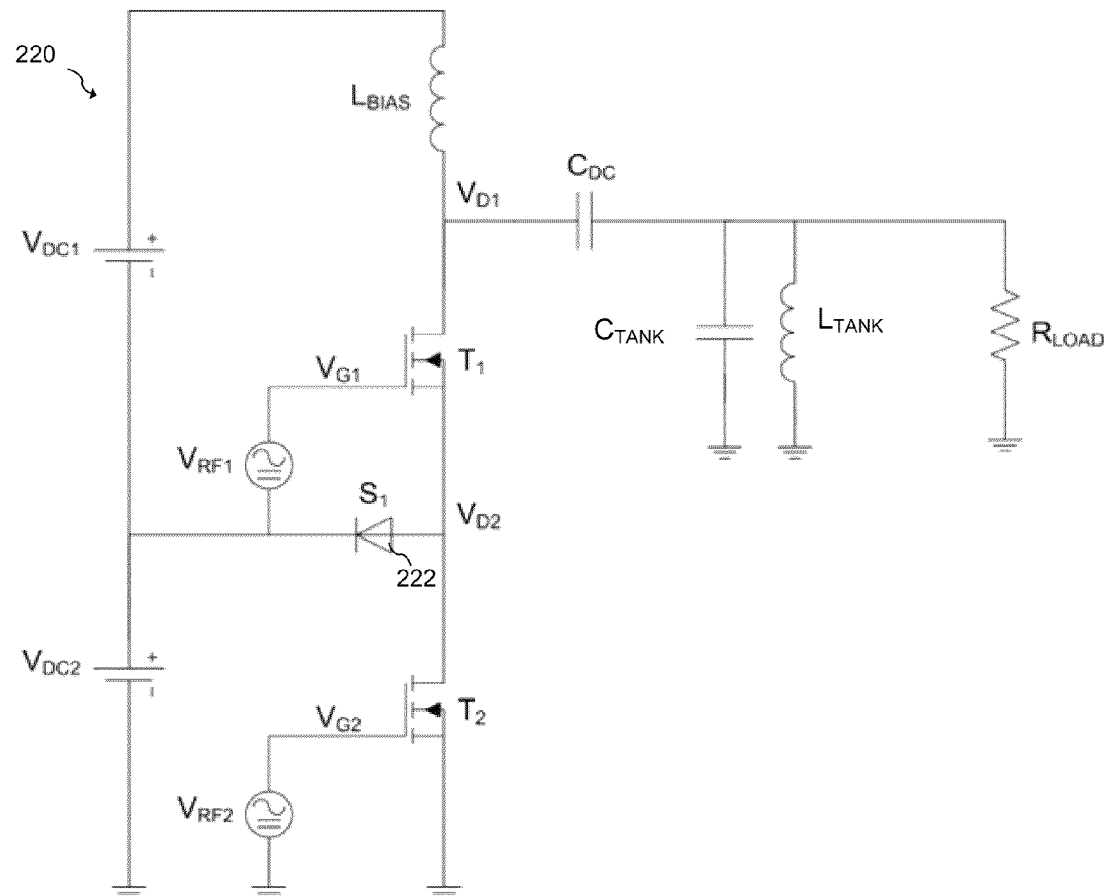
FIGS. 3a and 3b illustrate an embodiment circuit having different switch embodiments.
Figure 3B:
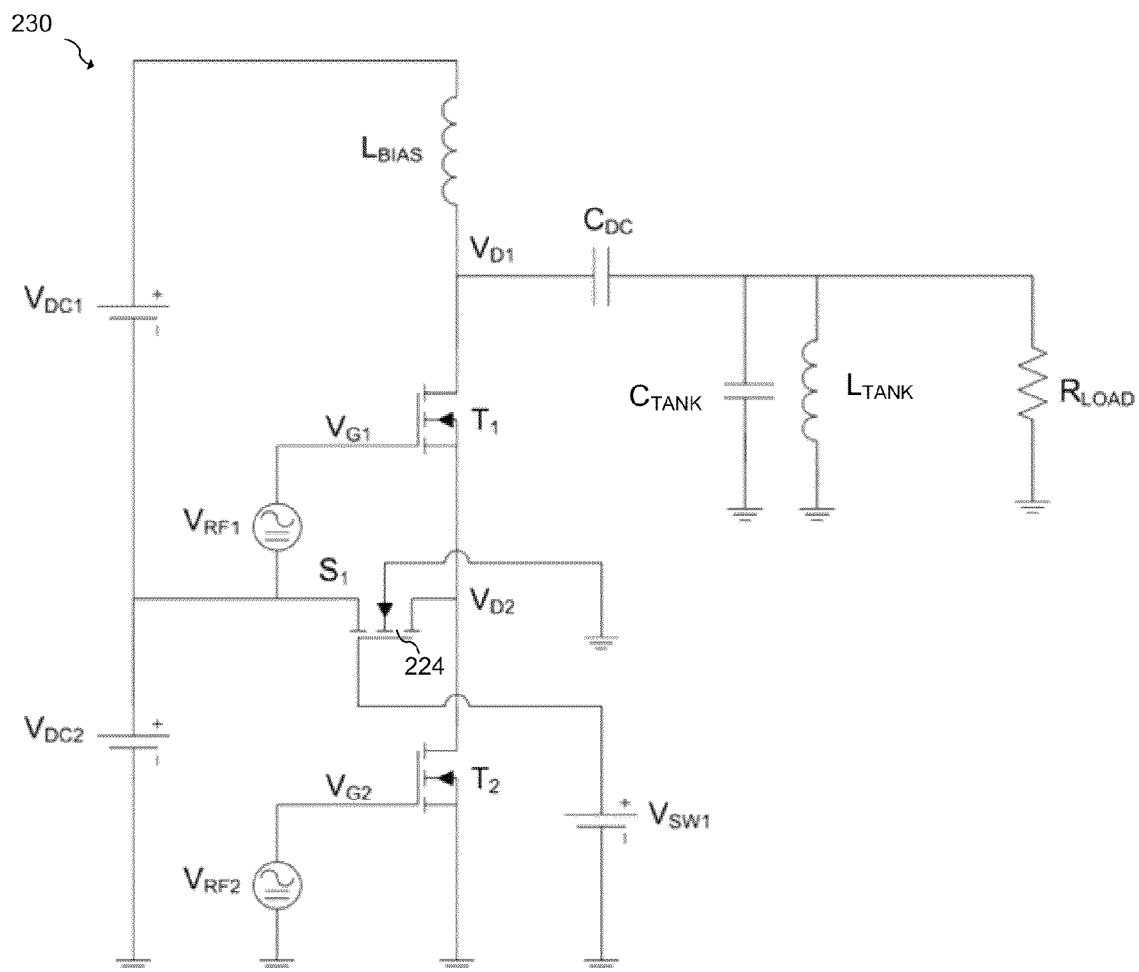

FIGS. 3a-b illustrate amplifiers that have switch $S_1$ implemented in two different ways. In amplifier 220 of FIG. 3a, switch $S_1$ is implemented using diode 222. In an embodiment, $S_1$ forms a low impedance path to the positive terminal of DC supply $V_{DC2}$ in modes in which signal $V_{RF1}$ is active and signal source $V_{RF2}$ is inactive. On the other hand, diode $S_1$ is reversed biased and/or has a relatively high impedance signal source $V_{RF1}$ is inactive and signal source $V_{RF2}$ is active and/or when $V_{RF1}$ and $V_{RF2}$ are both active. In an embodiment, diode 222 may be implemented, for example, using a Schottky diode.

In amplifier 230 of FIG. 3b, switch $S_1$ is implemented using transistor 224 that is controlled by voltage $V_{SW1}$, which may be controlled by the same controller (not shown) that controls the states of signal sources $V_{RF1}$ and $V_{RF2}$. In some embodiments, transistor 224 is sized to have a small on-resistance, since the lower the on-resistance, the less degeneration seen by transistor $T_1$ and the less increase in gate drive needed to achieve the same current as a non-degenerated transistor.

Figure 4A:
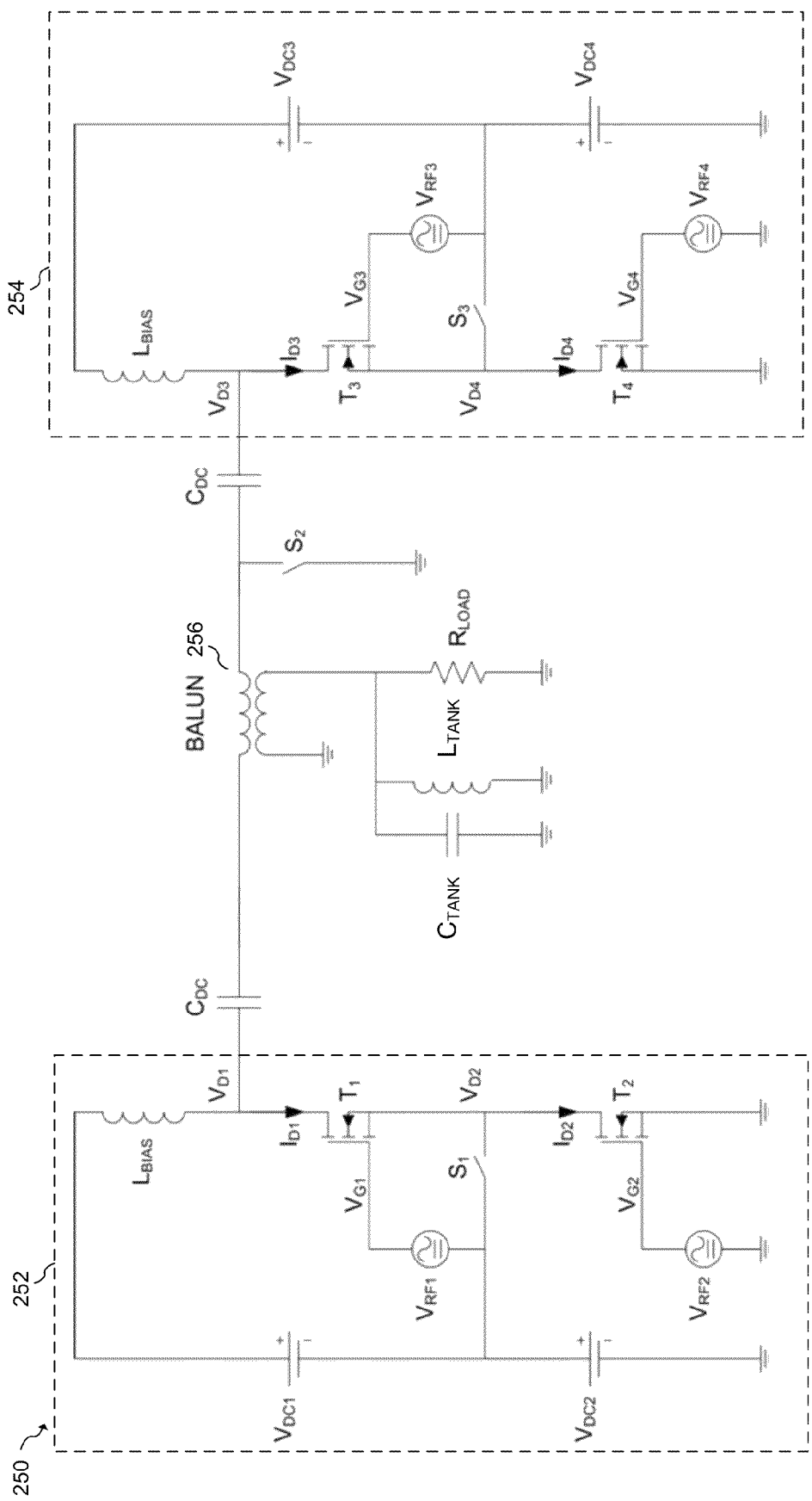

FIG. 4a illustrates amplifier 250 according to a further embodiment of the present invention. Here, two single-ended embodiment amplifiers 252 and 254 are arranged in a push-pull configuration in order to introduce additional output levels and achieve a higher output power. In an embodiment, amplifiers 252 and 254 coupled to load $R_{LOAD}$ via balun transformer 256. Switch S2 is further included to deactivate amplifier 254 in lower output power configurations. It should be noted that the transformer 256 does not operate as a BALUN (balanced/unbalanced) under all operating conditions.

In one embodiment, four output levels may be achieved using amplifier 250. For the first and lowest output level, only RF source $V_{RF1}$ is operational and switches $S_1$ and $S_2$ are closed. FIG. 4c illustrates a waveform plot of gate voltages $V_{G1}, V_{G2}, V_{G3}$ and $V_{G4}$; FIG. 4d illustrates drain currents and voltages for transistors $T_1$ and $T_3$, and FIG. 4e illustrates drain currents and voltages for transistors $T_3$ and $T_4$ for this first mode of operation. As is shown in FIG. 4d, only drain current $I_{D1}$ of transistor $T_1$ constitutes signal current in this embodiment.

If the needed output voltage exceeds the output capability of transistor $T_1$, switch $S_1$ is opened, switch $S_2$ remains closed, and only RF source $V_{RF2}$ is operational and applied to the gate of transistor $T_2$ for a second mode of operation. In some embodiments, RF source $V_{RF1}$ may be operational as well. FIG. 4f illustrates a waveform plot of gate voltages $V_{G1}$, $V_{G2}, V_{G3}$ and $V_{G4}$; FIG. 4g illustrates drain currents and voltages for transistors $T_1$ and $T_3$, and FIG. 4h illustrates drain currents and voltages for transistors $T_3$ and $T_4$ for this second mode of operation. As is shown in FIGS. 4g and 4h, drain currents $I_{D1}$ and $I_{D2}$ of transistors $T_1$ and $T_2$ output signal current, and drain currents $I_{D3}$ and $I_{D4}$ of transistors $T_3$ and $T_4$ output no current.

For an output voltage range between, for example, about 50% and about 75% of the maximum output voltage range, switches $S_1$ and $S_2$ are open and switch $S_3$ is closed for a third mode of operation. The gate of $T_1$ is biased with a DC voltage, and transistors $T_2$ and $T_3$ are operated in an asymmetric push-pull mode by activating RF signal sources $V_{RF2}$ and $V_{RF3}$, for example, with equal amplitudes and opposite phases. FIG. 4i illustrates a waveform plot of gate voltages $V_{G1}, V_{G2}, V_{G3}$ and $V_{G4}$; FIG. 4j illustrates drain currents and voltages for transistors $T_1$ and $T_3$, and FIG. 4k illustrates drain currents and voltages for transistors $T_3$ and $T_4$ for this third mode of operation. As is shown in FIGS. 4j and 4k, drain currents $I_{D1}, I_{D2}$, and $I_{D3}$ of transistors $T_1, T_2$ and $T_3$ output signal current, and drain currents $I_{D4}$ of transistor $T_4$ outputs no current.

At the fourth and highest output level, all switches $S_1, S_2$ and $S_3$ are open, a constant bias is applied to the gates of transistors $T_1$ and $T_2$, and transistors $T_2$ and $T_4$ are operated in asymmetric an push-pull mode by activating RF signal sources $V_{RF2}$ and $V_{RF4}$, for example, with equal amplitudes and opposite phases. Here, amplifier 250 is operates in a symmetric push-pull mode. FIG. 4l illustrates a waveform plot of gate voltages $V_{G1}, V_{G2}, V_{G3}$ and $V_{G4}$; FIG. 4m illustrates drain currents and voltages for transistors $T_1$ and $T_3$, and FIG. 4n illustrates drain currents and voltages for transistors $T_3$ and $T_4$ for this third mode of operation. As is shown in FIGS. 4m and 4n, drain currents $I_{D1}, I_{D2}, I_{D3}$ and $I_{D4}$ of transistors $T_1, T_2, T_3$ and $T_4$ output signal current.

Figure 4B:
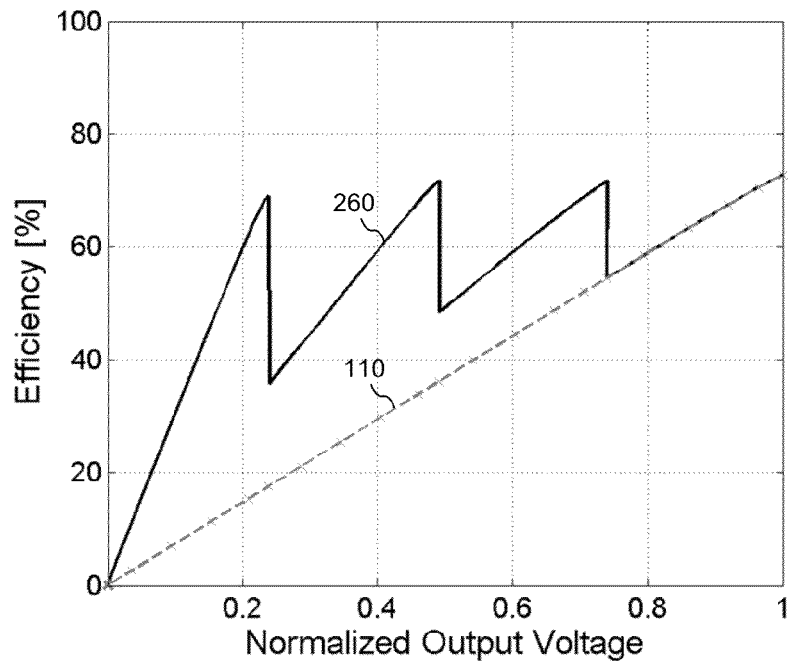

An efficiency plot for this embodiment four-level mode of operation for amplifier 250 is illustrated in FIG. 4b illustrating four efficiency peaks for curve 260. Curve 110 showing the efficiency of a single ended cascode amplifier is also shown for comparison.

Figure 4O:
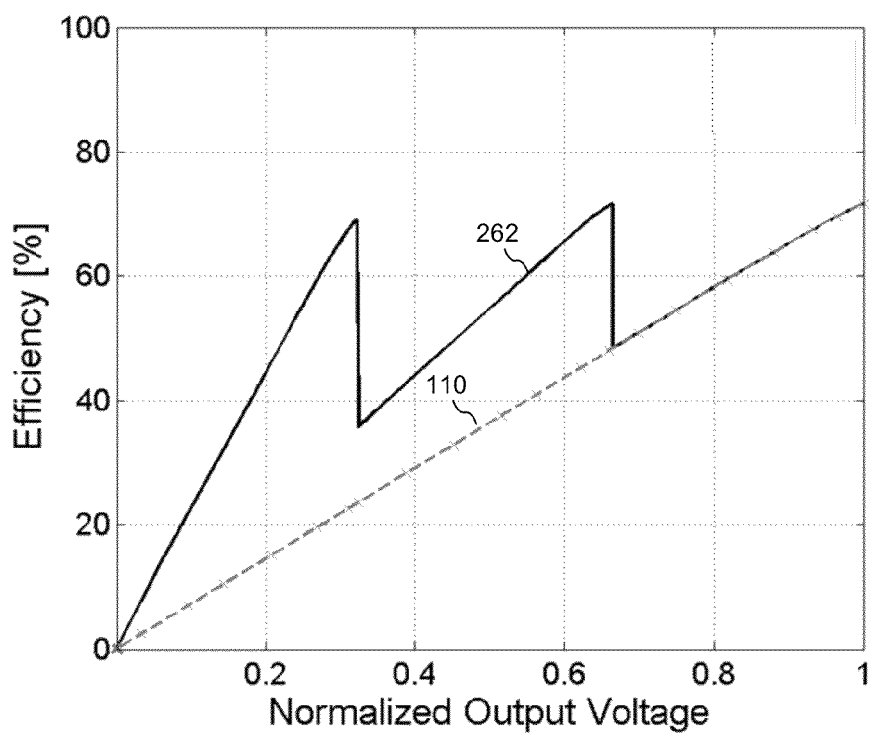
Figure 4C:
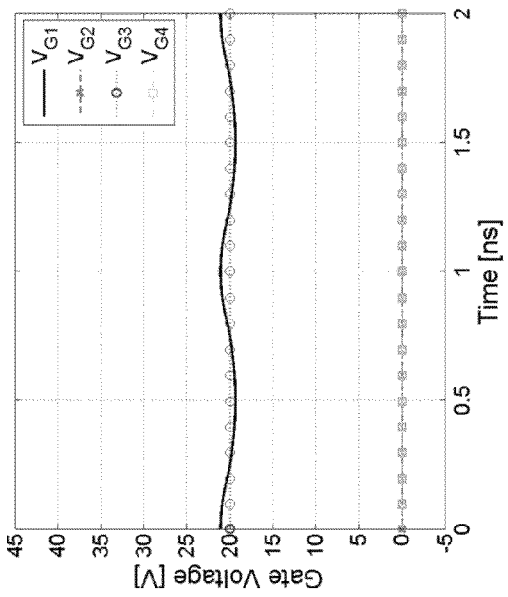
Figure 4E:
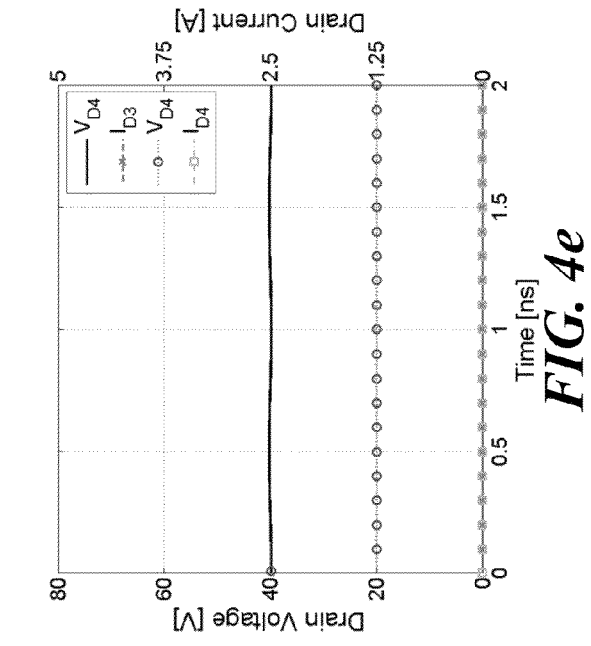
Figure 4D:
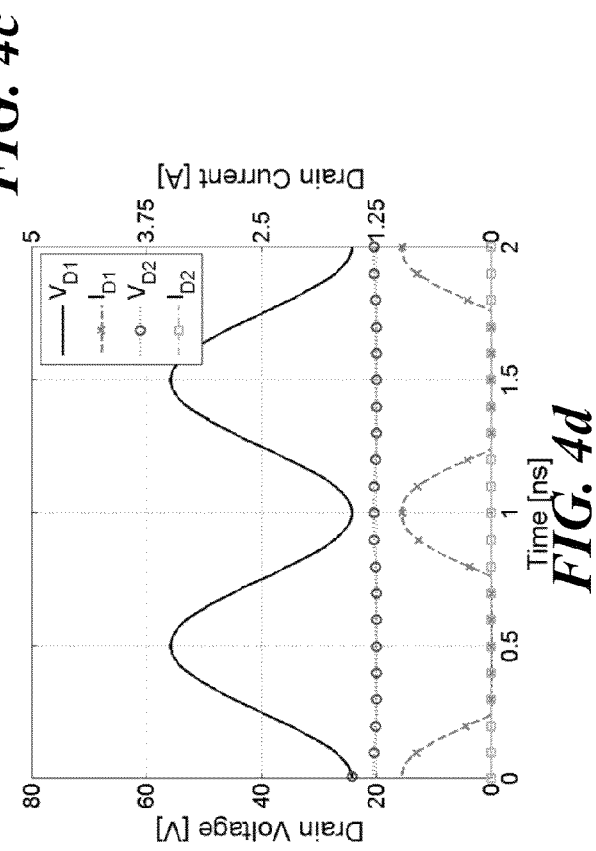
Figure 4H:
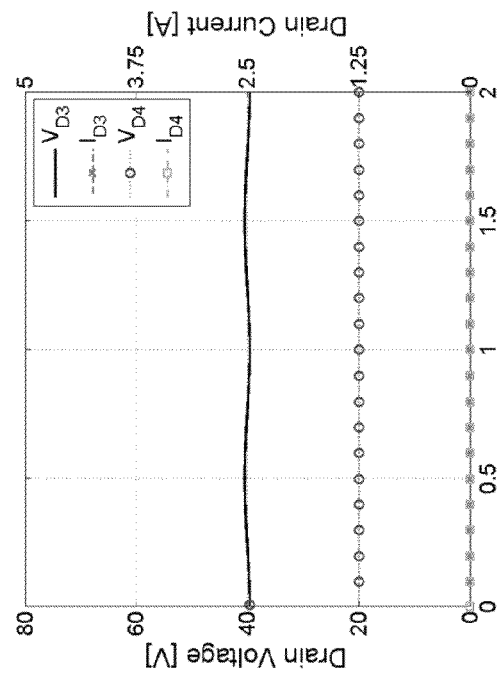
Figure 4F:
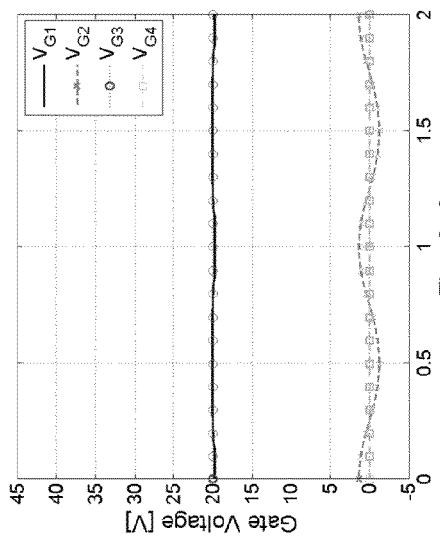
Figure 4G:
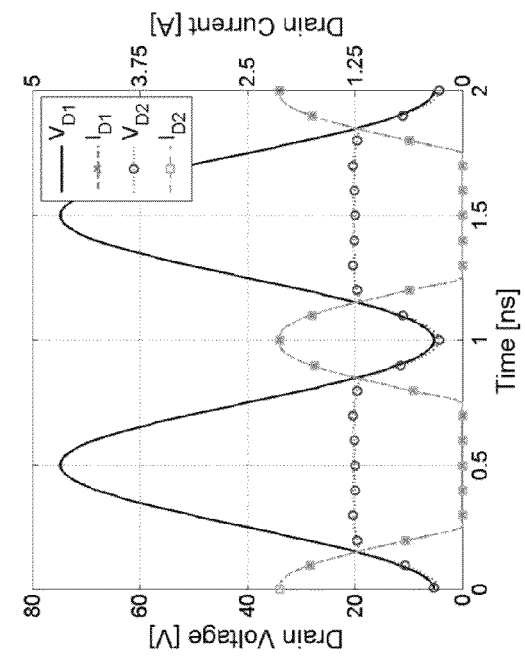
Figure 4N:
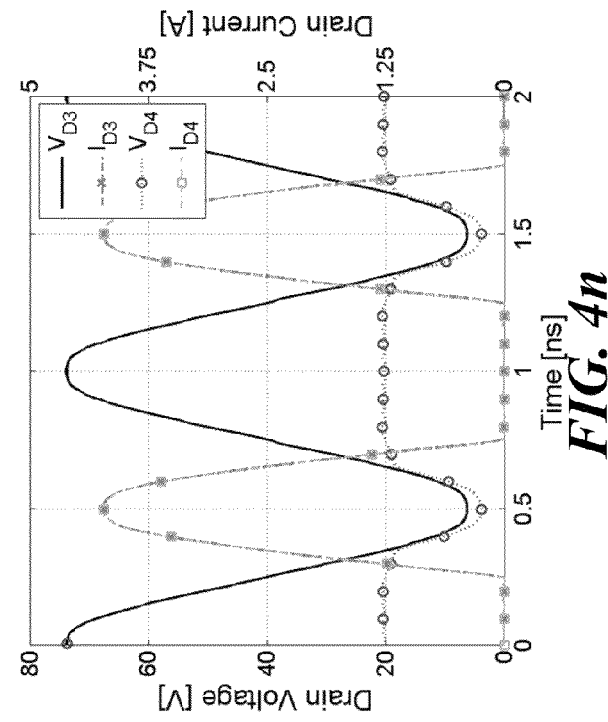
Figure 4L:
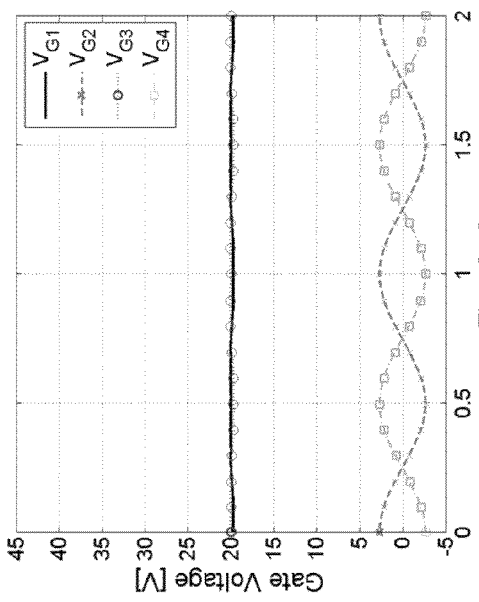
Figure 4M:
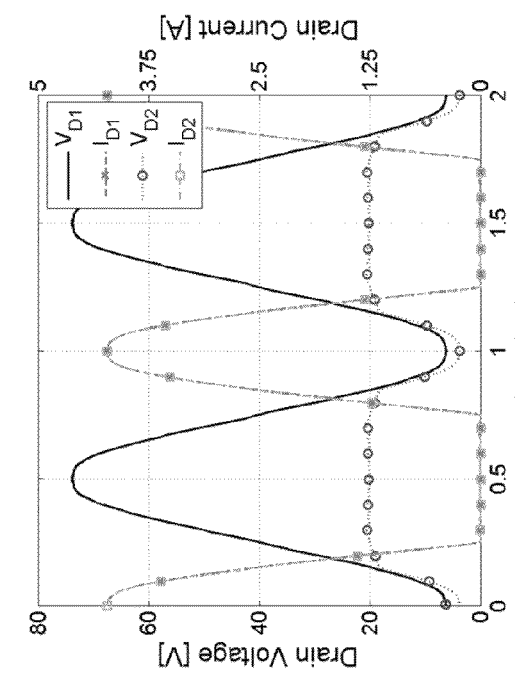

In some embodiments, switch $S_2$ may be omitted such that amplifier 250 has three levels of operation. An efficiency plot for this embodiment three-level mode of operation for amplifier 250 is illustrated in FIG. 4o illustrating three efficiency peaks for curve 262. Curve 110 showing the efficiency of a single ended cascode amplifier is also shown for comparison.

Figure 5A:
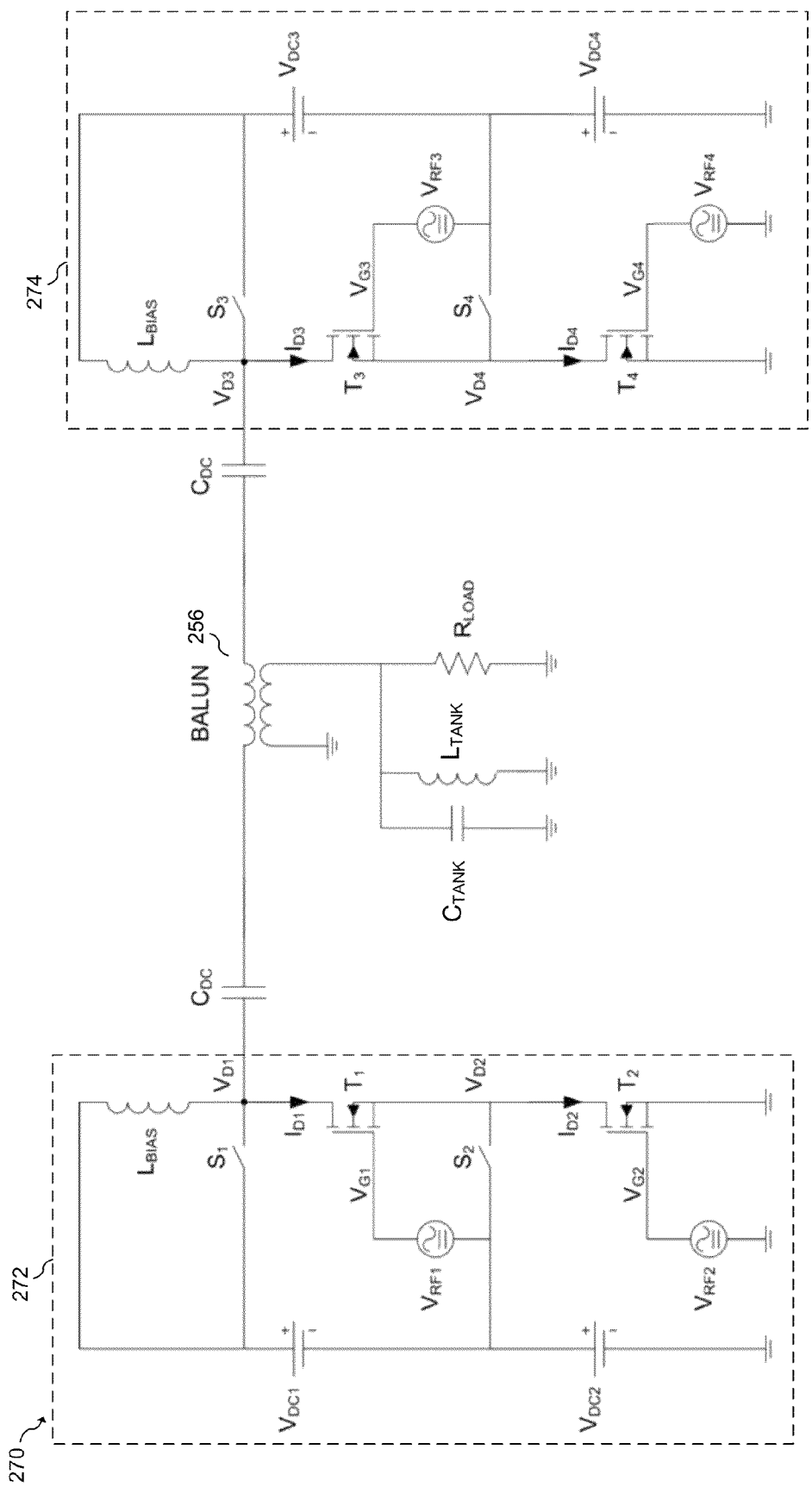
FIG. 5a illustrates a further embodiment circuit arranged in a push-pull configuration and FIG. 5b illustrates an associated efficiency graph.

FIG. 5a illustrates amplifier 270 according to a further embodiment. Amplifier 270 has single-ended amplifiers 272 and 274, each of which may be individually enabled and disabled via switch $S_1$ in amplifier 272 and switch $S_3$ in amplifier 274 that each shorts out respective bias inductors $L_{BIAS}$. In some embodiments, the function of function of switch $S_3$ in FIG. 5a is equivalent to the function of switch $S_2$ shown in FIG. 4a. In an embodiment, different supply voltages are used for supplies $V_{DC1}, V_{DC2}, V_{DC3}$ and $V_{DC4}$ in order to provide up to 8 different voltage level outputs. For example, in one embodiment, these supply voltages are set such that $V_{DC1}=20V, V_{DC2}=18V, V_{DC3}=10V$ and $V_{DC4}=25V$. Alternatively, other DC voltages may be used for supplies $V_{DC1}, V_{DC2}, V_{DC3}$ and $V_{DC4}$.

In an embodiment, the following switch combinations may be used: in a first output mode, switches $S_1$ and $S_4$ are closed and switches $S_2$ and $S_3$ are open (10V); in a second output mode switches $S_2$ and $S_3$ are closed and switches $S_1$ and $S_4$ are open (20V); in a third output mode switches $S_2$ and $S_4$ are closed and switches $S_1$ and $S_3$ are open (30V); in a fourth output mode switch $S_1$ is closed and switches $S_2, S_3$ and $S_4$ are open (35V); in a fifth output mode switch $S_3$ is closed and switches $S_1, S_2$ and $S_4$ are open (38V); in a sixth output mode switch $S_4$ is closed and switches $S_1, S_2$ and $S_3$ are open (48V); in a seventh output mode switch $S_2$ is closed and switches $S_1$, $S_3$ and $S_4$ are open (55V); and in an eighth output mode switches $S_1$ to $S_4$ are open (73V). In alternative embodiments of the present invention, different DC voltage levels corresponding to different output modes may be used according to the particular system and its specifications.

Figure 5B:
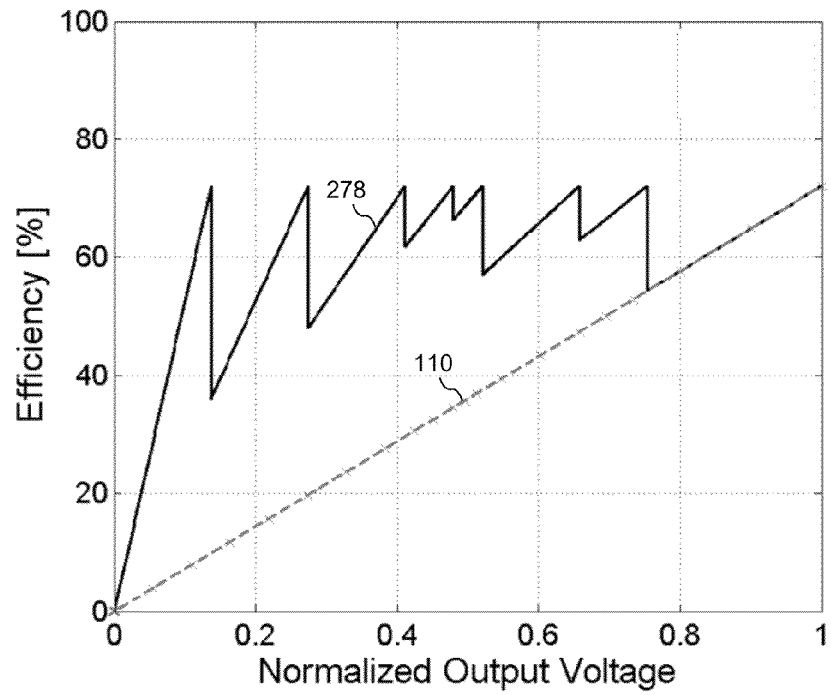

An efficiency plot for this embodiment eight-level mode of operation for amplifier 270 is illustrated in FIG. 5b illustrating eight efficiency peaks for curve 278. Curve 110 showing the efficiency of a single ended cascode amplifier is also shown for comparison. It should be understood that the location of each peak of curve 278 is adjustable by adjusting the DC voltages of DC voltage supplies $V_{DC1}, V_{DC2}, V_{DC3}$ and $V_{DC4}$.

In accordance with a further embodiment, a pulse-width modulated signal may be used to drive embodiment amplifiers. For example, a discrete-time pulse-width modulated signal is created by calculating a finite number of basis functions representing an output PWM signal. The band limited nature of these basis functions prevent aliasing due to the discrete time nature of the signal, thereby allowing for a high-dynamic range and a low out-of-band noise floor. The use of basis functions to generate pulse-width modulated signals to efficiently drive an amplifier (PA) is described in U.S. patent application Ser. No. 13/081,628 filed on Apr. 7, 2011 entitled "System and Method for Generating a Pulse-width Modulated Signal," which application is incorporated by reference herein in its entirety. Furthermore, basis functions may be combined to form multi-level pulse-width modulated signals as described in U.S. patent application Ser. No. 13/236,385 filed on Sep. 19, 2011 entitled "System and Method for Generating a Radio Frequency Pulse-width Modulated Signal," which applications is incorporated by reference herein in its entirety.

Figure 6A:
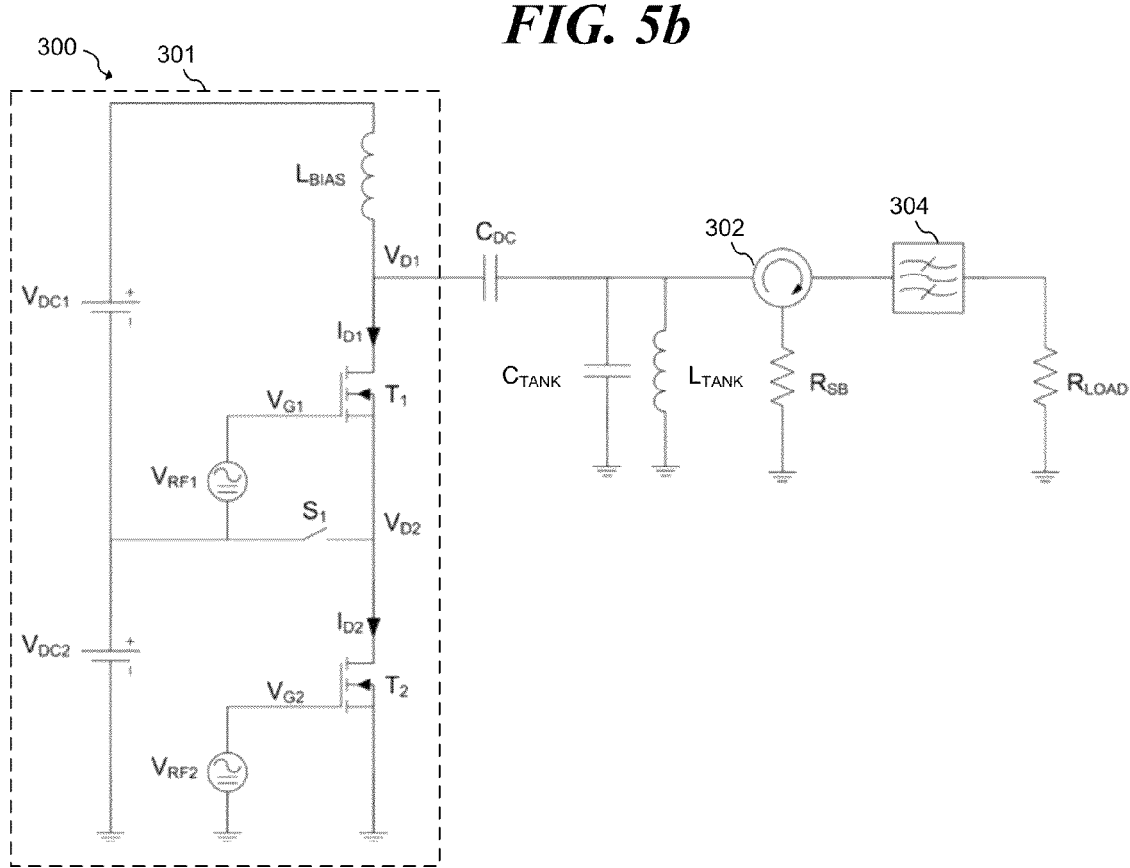
FIGS. 6a and 6i illustrates embodiment circuits configured for PWM operation and FIGS. 6b, 6c, 6d, 6e, 6f, 6g, 6h, 6j and 6k illustrate associated waveform graphs.

FIG. 6a illustrates embodiment system 300 configured to generate a multi-level pulse-width modulated signal. Here, system 300 has embodiment amplifier 301 as described above, coupled to dc blocking capacitor $C_{DC}$, parallel tank components $C_{TANK}$ and $L_{TANK}$, circulator 302 coupled to resistors $R_{SB}$, and bandpass filter 304. The load of system 300 is modeled as resistor $R_{LOAD}$. In an embodiment, pulse-width modulated signals are separately introduced to the gates of transistors $T_1$ and $T_2$. In one operational mode, switch $S_1$ is closed and a pulse-width modulated signal is coupled to the gate of $T_1$ while transistor $T_2$ is disabled. In a second operational mode, a multi-level pulse-width modulated signal is multiplexed between the gate of transistor $T_1$ and transistor $T_2$ while switch $S_1$ is controlled accordingly.

In an embodiment, carrier bursting techniques are used to drive the gates of transistors $T_1$ and $T_2$ with a Pulse Width Modulation (PWM) keyed RF signal. In an embodiment, these PWM signals are square-wave signals, or are harmonically rich, thereby resulting in sidebands that are removed by bandpass filter 304. In an embodiment, these sidebands are reflected from bandpass filter 304 and their energy is dissipated by sideband resistor $R_{SB}$ via circulator 302. By using circulator 302, amplifier 301 may be loaded by a real load resistance in the frequency range of the generated sidebands, and thus the input impedance of bandpass filter 304 has little, if any influence on the operation of amplifier 301. In such an embodiment, amplifier 301 may be operated at its most efficient operating points, and the desired output voltage may be generated by switchably introducing signals via source $V_{RF1}$ and $V_{RF2}$ in a PWM fashion.

Figure 6D:
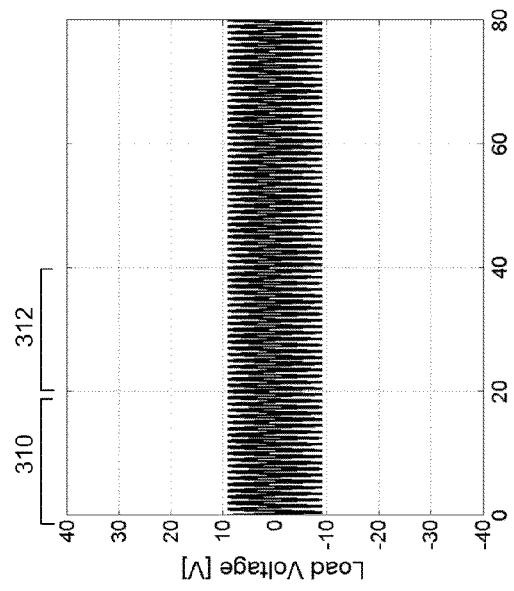
Figure 6B:
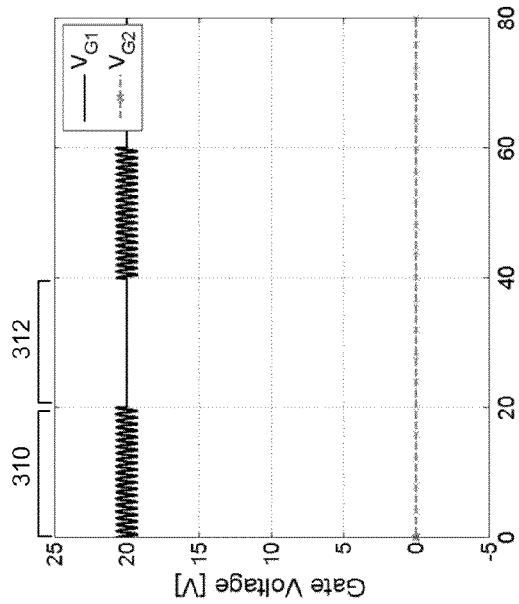
Figure 6C:
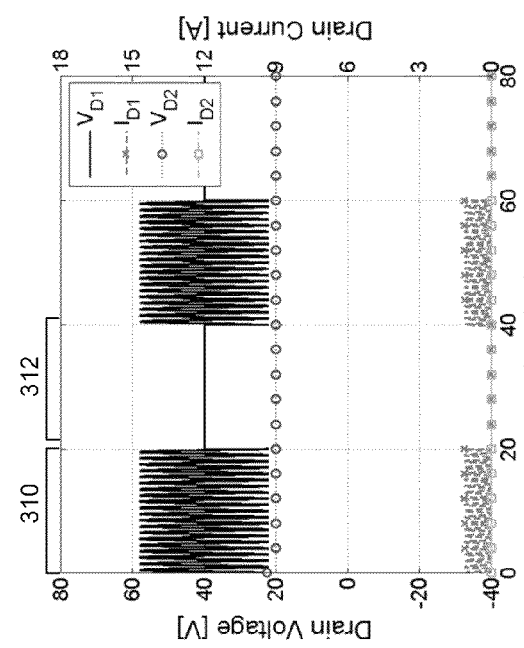

FIGS. 6b-d illustrate waveform diagrams of the operation of amplifier 301 at an operating point corresponding to a relative output voltage of out 25% of the maximum output voltage and a 50% duty cycle. During the first portion 310 of the illustrated modulation period, switch $S_1$ is closed and only transistor $T_1$ is active. Here, amplifier 301 operates with a relative output of 50%. During second portion 312 of the illustrated modulation period, no transistors are active, although switch $S_1$ may or may not be active. Therefore, the amplifier is operating at 0% of its maximum output. The combination of a 50% duty cycle and alternative between a 50% output and a 0% output yields a signal having an amplitude 25% of the maximum amplitude at resistor $R_{LOAD}$. FIG. 6b illustrates gate voltages $V_{G1}$ and $V_{G2}$ of transistors $T_1$ and $T_2$; FIG. 6c illustrates drain currents $I_{D1}$ and $I_{D2}$, drain voltages $V_{D1}$ and $V_{D2}$ of transistors $T_1$ and $T_2$; and FIG. 6d illustrates the loaded output voltage at resistor $R_{LOAD}$ corresponding to about 25% of the maximum output level.

Figure 6G:
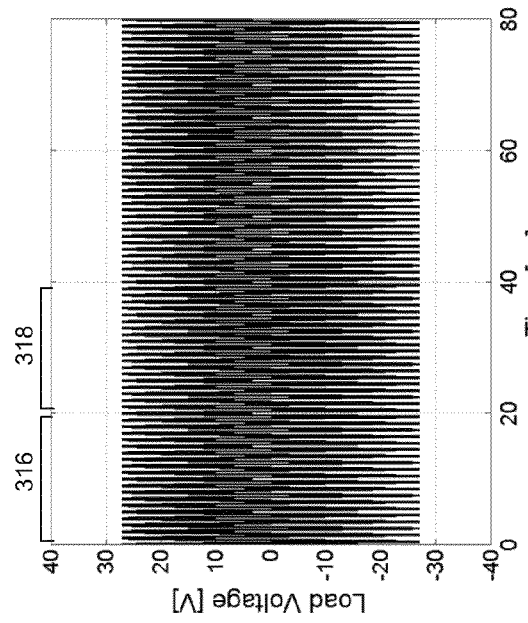
Figure 6E:
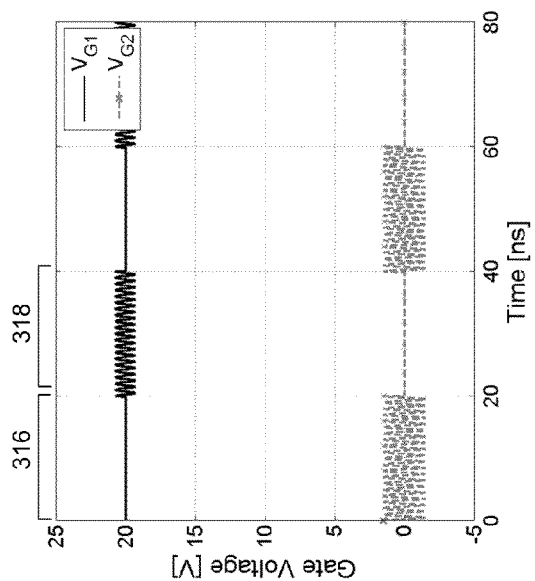
Figure 6F:
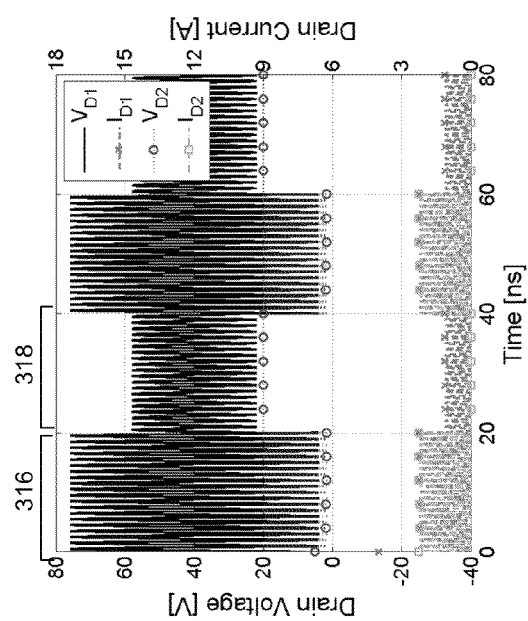

FIGS. 6e-g illustrate waveform diagrams of the operation of amplifier 301 at an operating point corresponding to switching between introducing a signal at source $V_{RF1}$ with switch $S_1$ closed, and introducing a signal at source $V_{RF1}$ with switch $S_1$ open with a 50% duty cycle. During the first portion 316 of the illustrated modulation period, switch S1 is open and a signal introduced at the gate of transistor $T_2$ while the gate of transistor $T_1$ is kept at a constant DC voltage. Here the drain voltage of $T_1$ may be configured to have a maximal swing in order to enhance the amplifier's efficiency. During second portion 318 of the illustrated modulation period, switch $S_1$ is closed and a signal is introduced to the gate of transistor $T_1$. Again, the drain voltage of $T_1$ may be maximized to enhance the amplifier's efficiency. Switching between these operational modes at a 50% duty cycle produces a relative output voltage of 75% of the maximum level. FIG. 6e illustrates gate voltages $V_{G1}$ and $V_{G2}$ of transistors $T_1$ and $T_2$; FIG. 6f illustrates drain currents $I_{D1}$ and $I_{D2}$, drain voltages $V_{D1}$ and $V_{D2}$ of transistors $T_1$ and $T_2$; and FIG. 6g illustrates the loaded output voltage at resistor $R_{LOAD}$ corresponding to about 75% of the maximum output level. It should be appreciated that the examples of FIGS. 6b-g are two examples of the many specific possible output levels that may be achieved using amplifier 301. In alternative embodiments, other duty cycles and output levels may be combined to produce other output amplitudes. Moreover, the phase of the signals may also be modulated to transmit information in the phase of the output signal in addition to its amplitude.

Figure 6H:
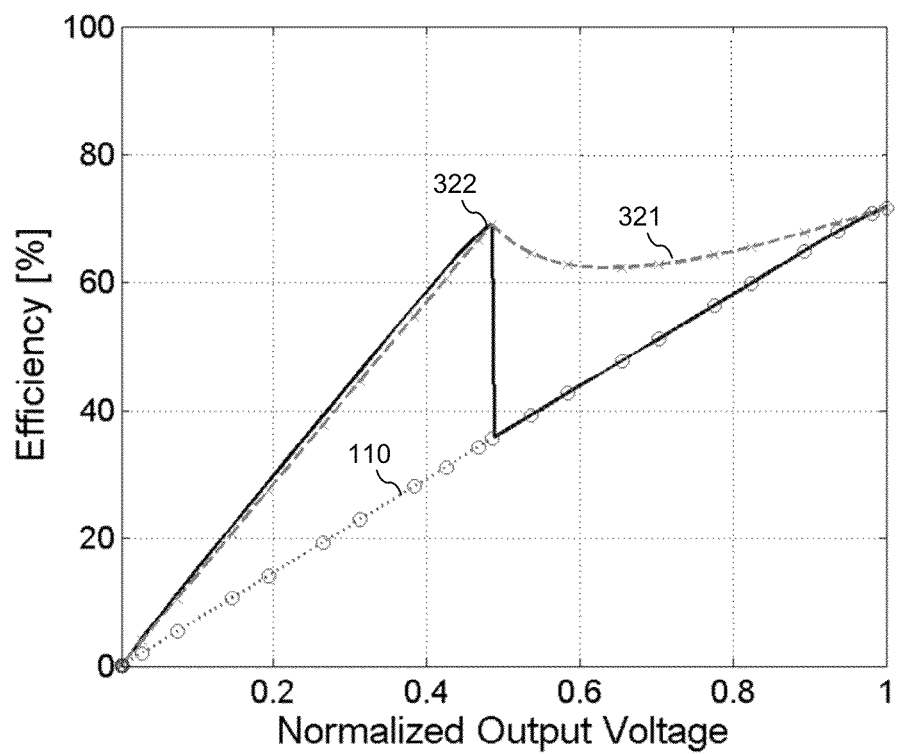

FIG. 6h illustrates efficiency curve for amplifier 301 under PWM operation under the assumption that amplifier 301 is operated at maximum efficiency in all modes. The droop in curve 321 between normalized output voltages of 0.5 and 1.0 is primarily due to sideband energy dissipated by resistor $R_{SB}$. Curve 322 representing a two-level embodiment described with respect to FIG. 1a, and curve 110 representing a cascoded amplifier are also shown for reference.

Figure 6I:
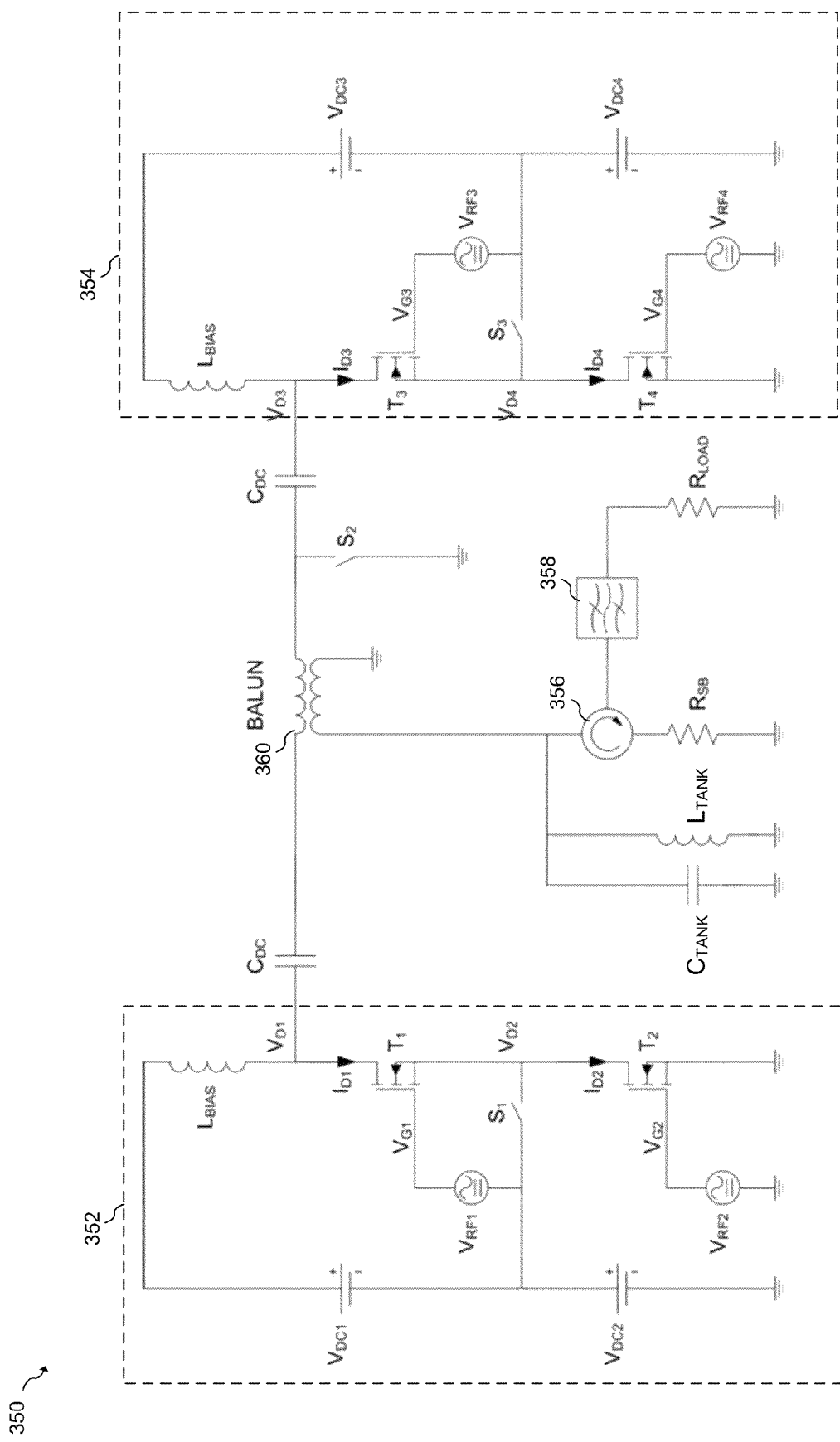

The embodiment of FIG. 6a may be further extended to a push-pull approach, as illustrated in FIG. 6i, which illustrates system 350. System 350 has embodiment amplifiers 352 and 354 coupled to a load represented by $R_{LOAD}$ via balun 360, circulator 356 and bandpass filter 358. In an embodiment, system 350 may be configured to output signals with four output levels, as described with respect to the embodiment of FIG. 4a, as described above. By introducing PWM signals with sources $V_{RF1}$, $V_{RF2}$, $V_{RF3}$ and $V_{RF4}$, a multi-level PWM signal may be generated at the output of bandpass filter 358.

Figure 6J:
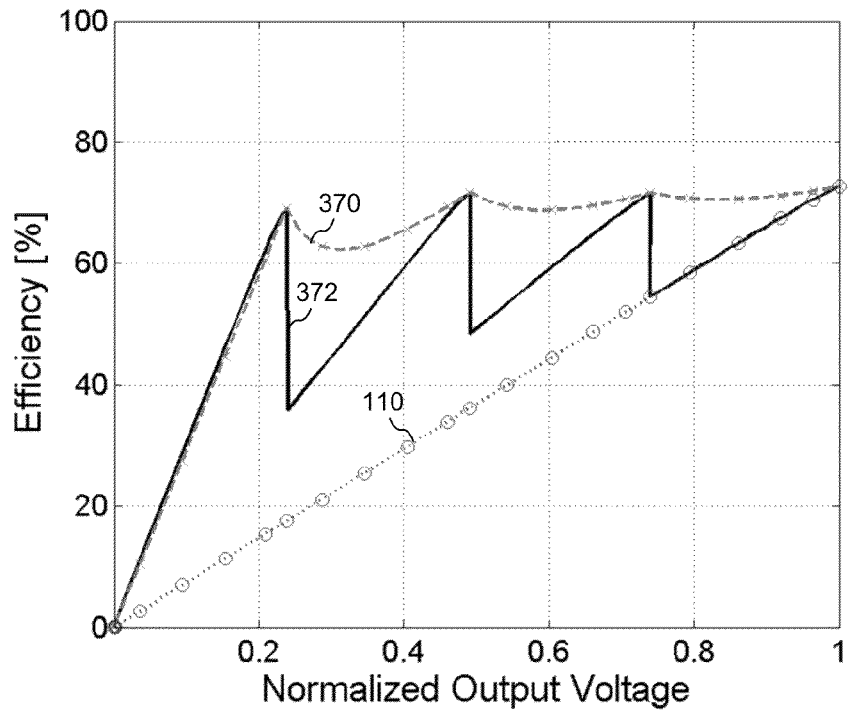

FIG. 6j illustrates efficiency curve 370 for system 350 under PWM operation under the assumption that system 350 is operated at maximum efficiency in all modes using equal supply voltages. Curve 372 representing a four-level embodiment described with respect to FIG. 4a, and curve 110 representing a cascoded amplifier are also shown for reference.

Figure 6K:
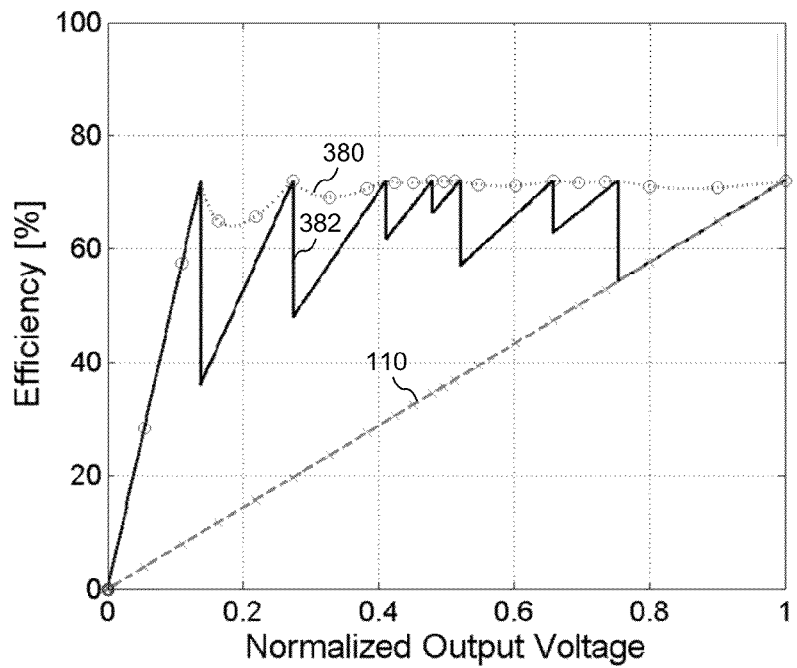

FIG. 6k illustrates efficiency curve 380 for an amplifier using a similar structure as the embodiment of 5a, but with the output of the balun loaded with the circulator and bandpass filter, as in FIG. 6i. Here, PWM operation is used under the assumption that the amplifier is operated at maximum efficiency in all modes using unequal supply voltages. Curve 382 representing a multi-level embodiment described with respect to FIG. 5a, and curve 110 representing a cascoded amplifier are also shown for reference.

Figure 7A:
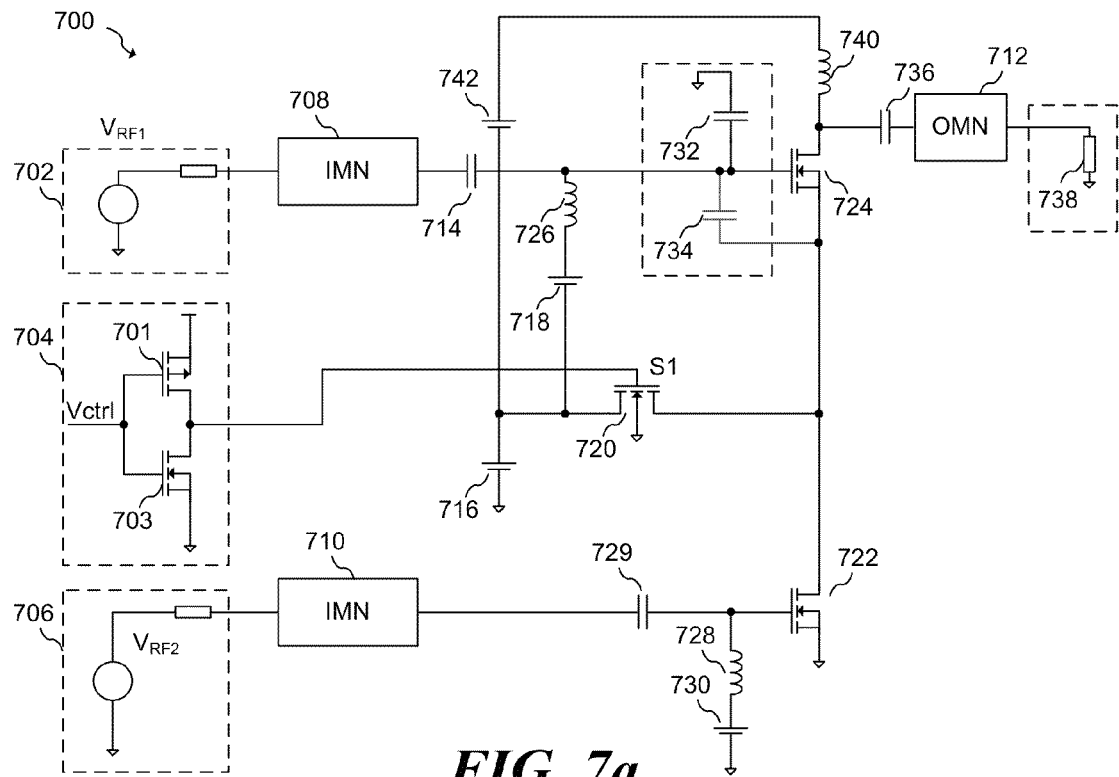
FIGS. 7a and 7b illustrate schematics of embodiment systems.

FIG. 7a illustrates a CMOS implementation of an embodiment amplifier 700. Amplifier 700 has input transistor 722, cascode transistor 724, and switch transistor 720. In an embodiment, these transistors may be implemented by NMOS devices as shown. In alternative embodiments of the present invention, other transistor types, such as PMOS transistors, may be used. Signal sources 702 corresponding to signal source $V_{RF1}$ and signal source 706 corresponding $V_{RF2}$, are illustrated as Thevenin equivalent circuits within dotted lines to show that these sources are not necessarily a part of amplifier 700. In embodiments of the present invention, signal sources 702 and 706 may be implemented using output stages of other elements within the system, for example signal generators, the output of digital to analog converters and the like. Inverter 704, which is implemented using PMOS device 701 and NMOS device 703, has an output coupled to the gate of switch transistor 720. Inverter 704 is also shown in dotted lines to signify that it is not necessarily a part of amplifier 700. It should be understood that the function of inverter 704 is to turn on or off switching transistor 720. Therefore, in alternative embodiments, and inverter 704 may be implemented with the output of other logic gates or other output stages. Signal Vctrl represents a control signal that may be generated, for example, by a controller. In an embodiment, signal sources 702 and 706, as well as switch transistor 720 are activated according to the embodiments described above.

In an embodiment, the gate of transistor 722 is coupled to signal source 706 via DC blocking capacitor 729 and input matching network 710. The bias to the gate of transistor 722 is provided with DC signal source 730 in series with inductor 728. In an embodiment, the voltage of DC signal source 730 is set to a voltage that provides a suitable bias for transistor 722. In an embodiment, DC voltage source 730 may be implemented using circuit techniques known in the art. For example, DC source 730 may be implemented using a current source that tracks the gate source voltage of transistor 722. Alternatively, other circuits may be used.

Transistor 724 is coupled to RF signal source 702 via input matching network 708 and DC blocking capacitor 714. The gate of transistor 724 may be biased, for example, by a series combination of DC voltage sources 716 and 718 in series with biasing inductor 726. In embodiments in which the threshold voltage of transistor 724 is 0 V, DC voltage source 718 may be omitted and bias inductor 726 may be directly coupled to the positive terminal of DC voltage source 716. Biasing inductor 740 is coupled to the drain of cascode transistor 724 and may be biased using DC voltage source 742. The drain of transistor 724 may be coupled to load resistance 738 via DC blocking capacitors 736 and the output matching network 712. Load resistor 738 is shown in dotted lines to signify that the load is not necessarily a part of amplifier Rather, load resistor 738 represents the load of amplifier 700. In an embodiment, input matching network 708 and 710, as well as output matching network 712 may be implemented using circuits and techniques known in the art.

In an embodiment, capacitor 732 may be included to control the gate voltage swing of transistor 724 when amplifier 700 is working in a cascode configuration. That is, when signal source 706 is active, switching transistor 720 is in a high impedance state, and transistor 724 operates as a cascode transistor. By using capacitor 732, a capacitive voltage divider together with the parasitic gate source capacitance 734 is built. The voltage divider ratio may be set, such that the maximum gate voltage is not exceeded and no overdrive of the transistor occurs. For other transistors such as HEMTs, 0V is the maximum voltage, and thus this voltage divider is used to prevent the conduction of the parasitic diodes in this case. It should be appreciated that this voltage divider is optional as it may be used to prevent transistors from being exposed to voltages that exceed their maximum ratings. As such, the voltage divider may be omitted, especially if the technology used withstands the applied voltages. The reference potential for capacitor 732 does not necessarily have to be ground, any other stable reference point, such as the supply voltage, would fulfill the same task. Parasitic gate capacitance 734 may be increased by adding a capacitor in parallel if required for the specific implementation.

Figure 7B:
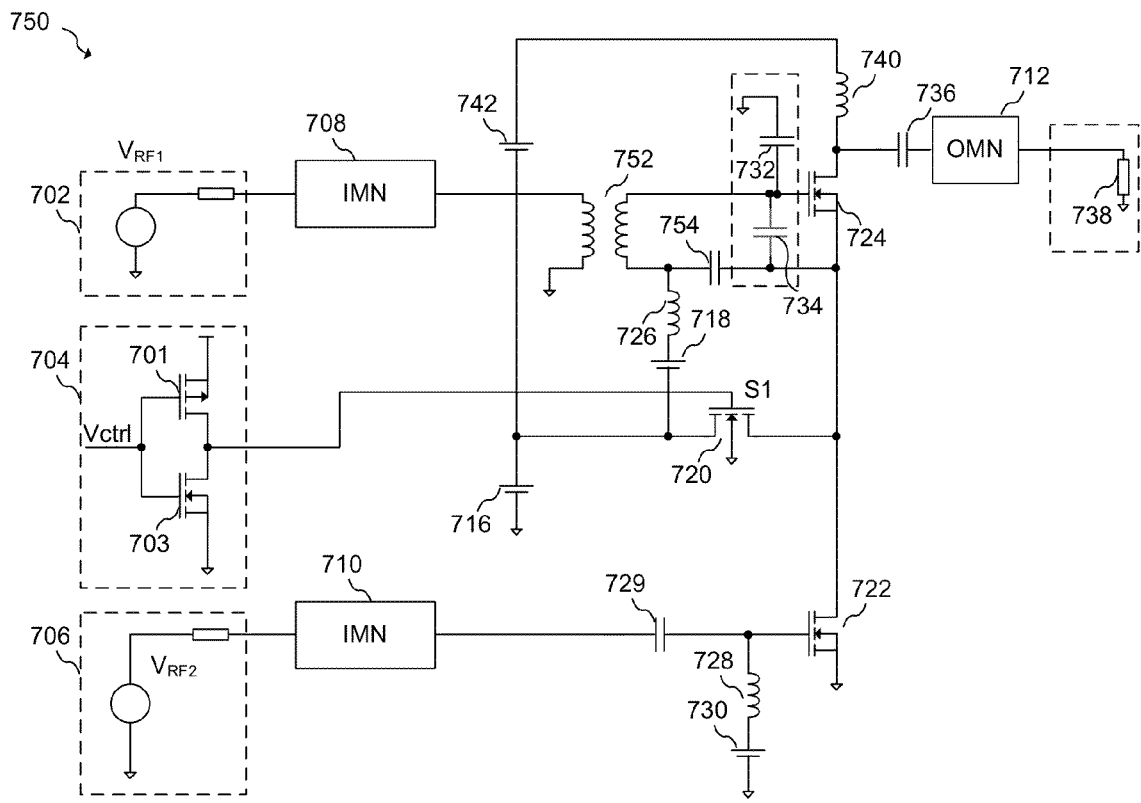

FIG. 7b illustrates amplifier 750 according to a further CMOS implementation. Embodiment of FIG. 7b is similar to the embodiment of 7a, except that the gate of transistor 724 is coupled to signal source 702 via transformer 752. DC blocking capacitor 754 is used to decouple the drain of transistor 722 to the secondary winding of a transformer 752.

Figure 8A:
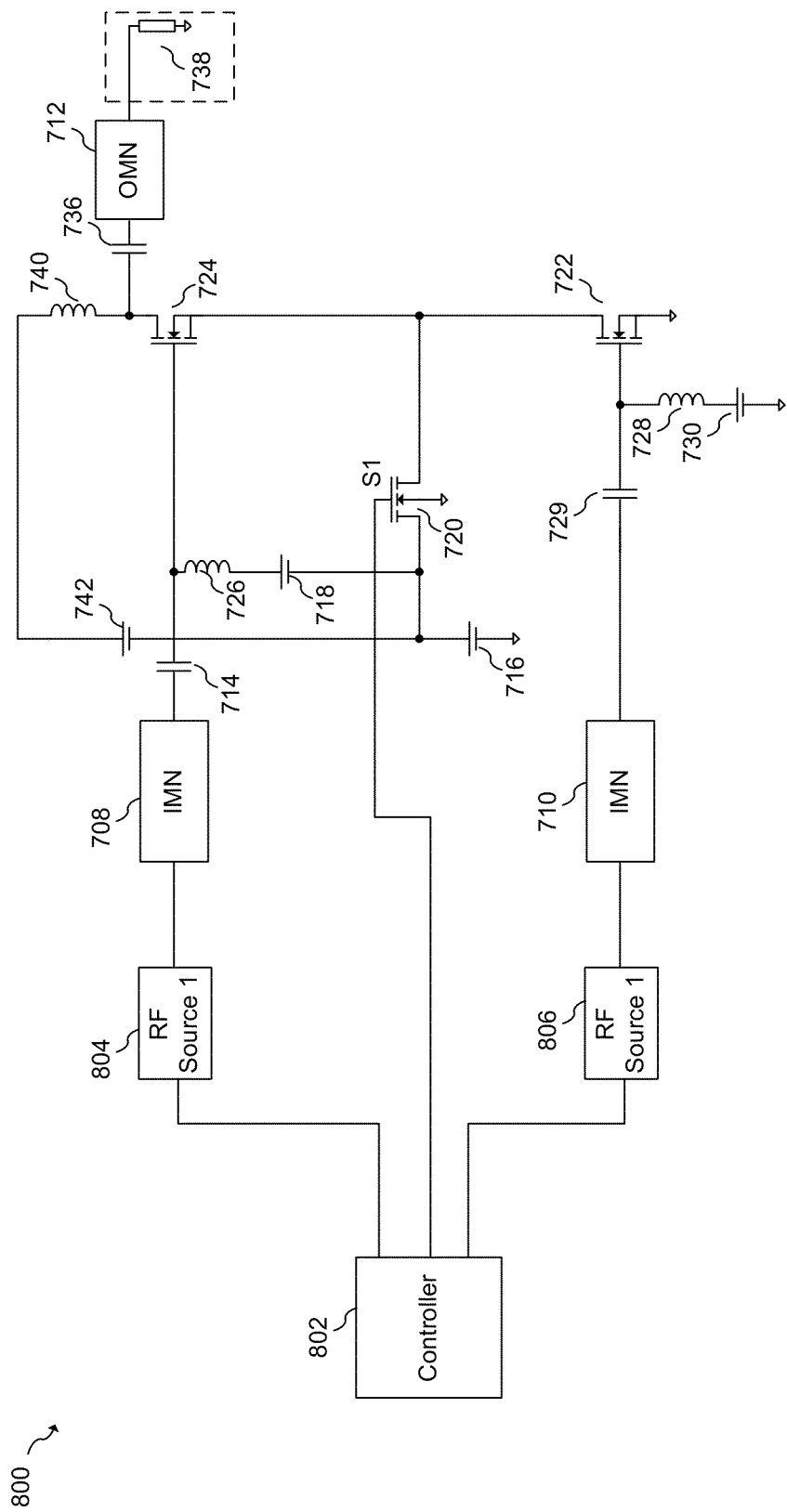
FIGS. 8a, 8b and 8c illustrate schematics of further embodiment systems.

FIG. 8a illustrates system 800 according to an embodiment of the present invention. System 800 has controller 802 coupled to RF signal sources 804 and 806. The output of RF sources 804 and 806 are coupled to the gates of transistors 724 and 722 via matching networks 708 and 710 respectively as described with respect to the embodiment of FIG. 7a. In an embodiment, controller 802 controls the outputs of RF sources 804 and 806 as well as controlling the state of the switching transistor 720. Controller 802 may also control the signal type as well as the phase and amplitude output by RF signal sources 804 and 806. In some embodiments, the output of RF sources 804 and 806 may be pulse width modulated waveform says described with respect to the embodiments of FIG. 6a and FIG. 6i.

Figure 8B:
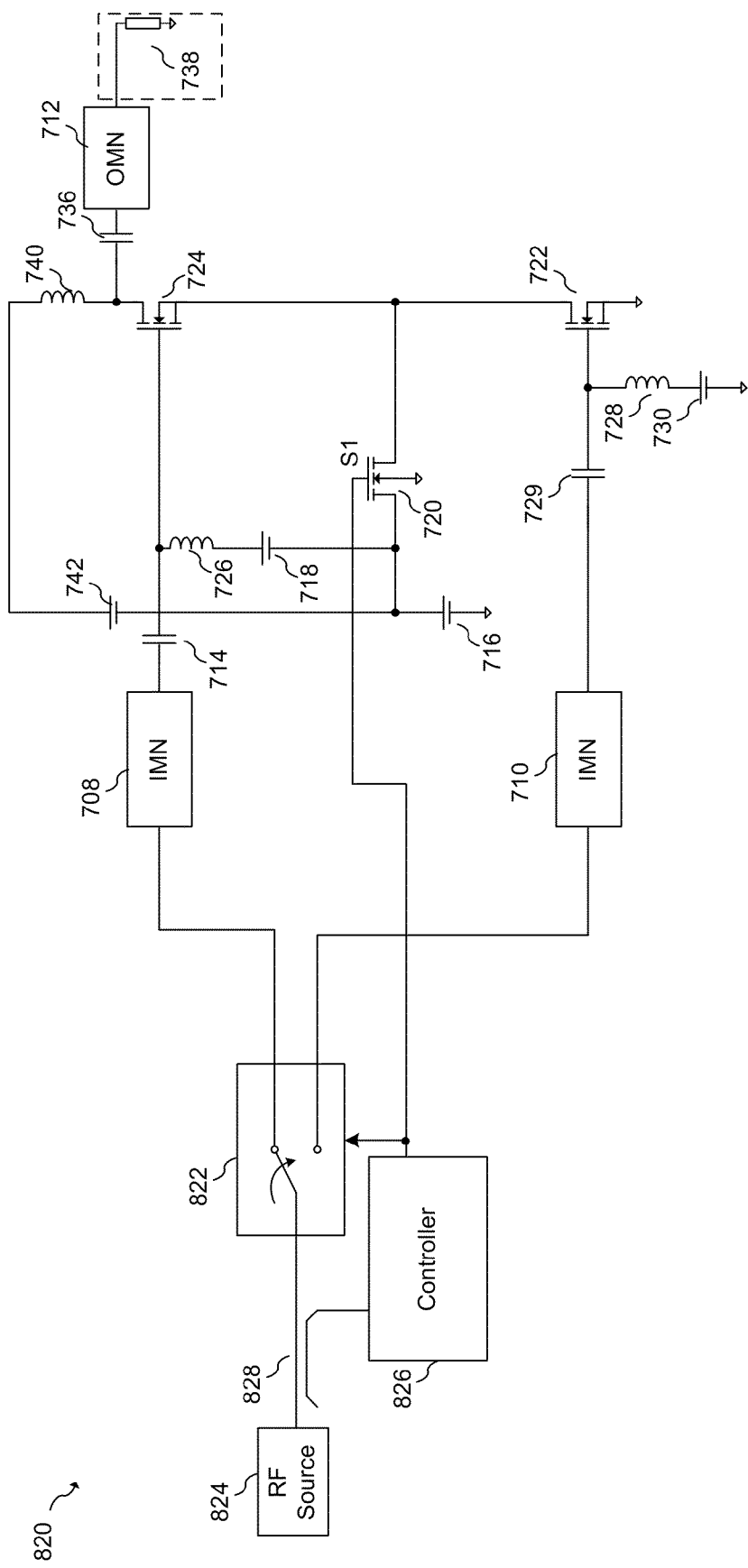

FIG. 8b illustrates system 820 according to a further embodiment of the present invention. Here, controller 826 controls switching network 822 that routes the output of RF signal source 824 to either the gate of transistor 724 or to the gate of transistor 722. Controller 826 further measures the power of the RF source as coupled by a coupler 828, and determines the state of switching network 822 according to the measured power. In addition, controller 826 also controls the state of switching transistor 720.

Figure 8C:
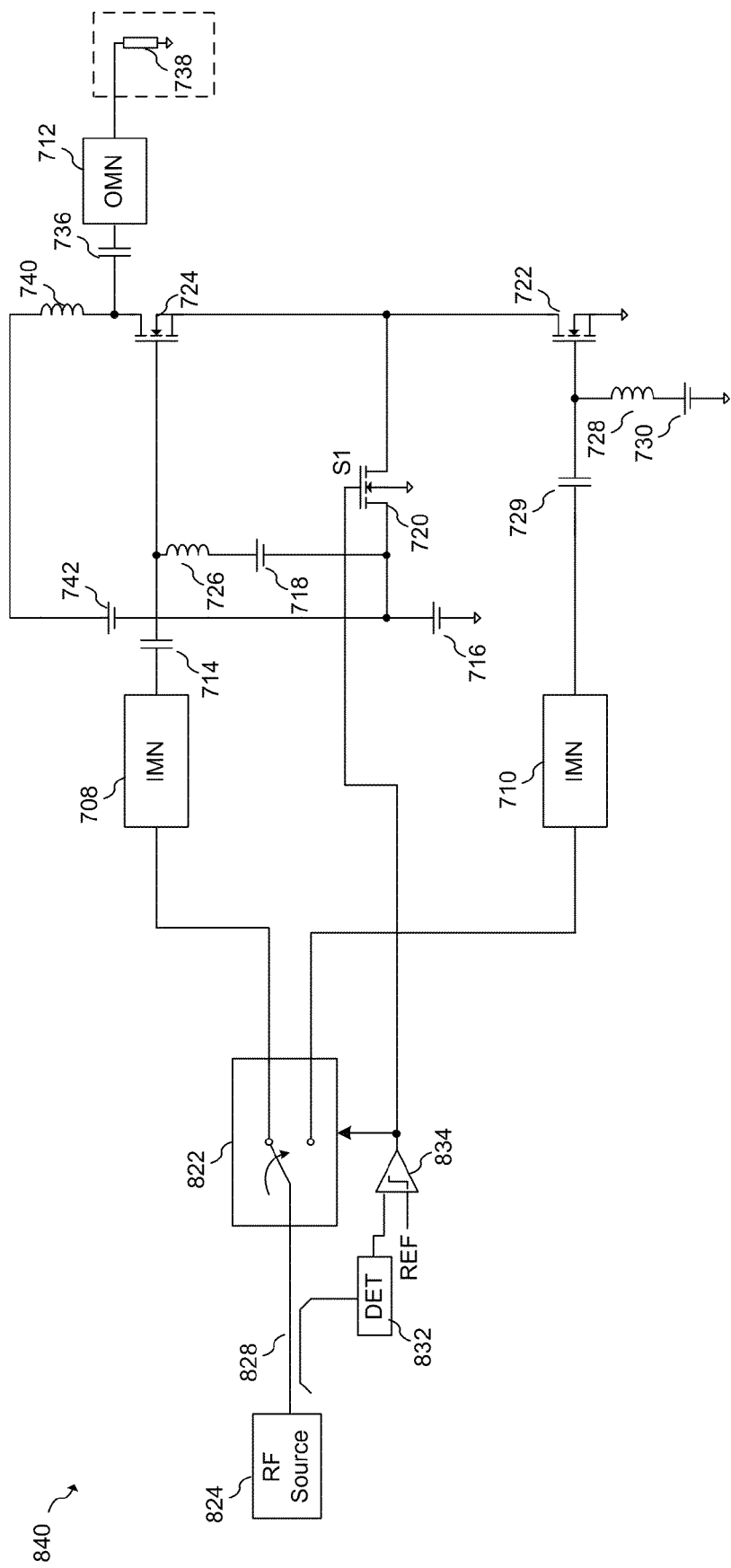

FIG. 8c illustrates system 840 according to another embodiment of the present invention. Here, detector 832 monitors power coupled via coupler 828 from RF source 824 and compares the detected power to threshold REF using comparator 834. The result of this comparison is used to set the state of RF switch 822 as well as the state of switching transistor 720. In such an embodiment, RF source 824 may be representative of an external RF signal to the amplified. Threshold REF may be set to a level that maximizes or optimizes the efficiency of the amplifier.

In alternative embodiments of the present invention, embodiment amplifiers may be implemented on a variety of processes. For example, a bipolar process, a CMOS process as shown in FIGS. 7a-b and 8a-c, gallium arsenide (GaAs) process, a gallium nitride (GaN) process and others. In one embodiment, the CMOS transistors shown in FIGS. 7a-b and 8a-c may be replaced with GaN HEMT devices.

In accordance with an embodiment, a system includes a first transistor and a second transistor. The first transistor has a first input node coupled to a first signal input, a first output node coupled to a first common node, and a first reference node coupled to a first reference voltage, and the second transistor has a second input node coupled to second signal input, a second output node coupled to an output of the system, and a second reference node coupled to the first common node. The system further includes a first switch switchably coupling the first common node to a second reference voltage.

In an embodiment, the system further includes a controller and the first switch has a control input coupled to the controller, wherein the first switch is configured to be open when the control input is in a first state, and the first switch is configured to be closed when the control input is in a second state. The controller may be configured to selectively couple a first signal to the first signal input when the control input is in the first state, and couple the first signal to the second signal input when the control input is in a second state. In a further embodiment, the controller is further configured to decouple the first signal from the second signal input when the control input is in the first state. Moreover, the controller may also determine whether the control input is in the first state or in the second state.

In an embodiment, the controller is configured to set the control input in the first state when the first signal has an amplitude greater than a first amplitude threshold, and the controller is configured to set the control input in the second state when the first signal has an amplitude less than the first amplitude threshold. In some embodiments, the first signal is a pulse-width modulated signal.

The system may also include a third transistor having a third input node coupled to a third signal input, a third output node coupled to the output of the system, and a third reference node coupled to the second output node of the second transistor. The system may also include a second switch switchably coupling the third reference node of the third transistor to a third reference voltage.

In some embodiments, the first transistor comprises a first FET and the second transistor comprises a second FET. For example, the first input node of the first transistor comprises a gate of the first FET; the first output node of the first transistor comprises a drain of the first FET; the first reference node of the first transistor comprises a source of the first FET; the second input node of the first transistor comprises a gate of the second FET; the second output node of the first transistor comprises a drain of the second FET; and the second reference node of the first transistor comprises a source of the second FET.

In accordance with another embodiment, a radio frequency (RF) transmission system includes a controllable signal source having a first RF signal output and a second RF signal output. The controllable signal source may be configured to provide an RF signal at the first RF signal output when an amplitude of the RF signal is greater than a threshold, and provide the RF signal at the second RF signal output when the amplitude of the RF signal is less than the threshold. The RF transmission system also includes an amplifier having a first transistor comprising a first input node coupled to the first RF signal output, a first output node coupled to a first common node, and a first reference node coupled to a first reference voltage; and a second transistor comprising a second input node coupled to the second RF signal output, a second output node coupled to an output of the amplifier, and a second reference node coupled to the first common node. The first switch switchably couples the first common node to a second reference voltage. The controllable signal source may be further configured to prevent the RF signal from being provided at the second RF signal output when the amplitude of the RF signal is greater than the threshold.

In an embodiment, the controllable signal source further includes a controller, and the first switch comprises a control input coupled to the controller. The controller may be configured to activate the first switch when the amplitude of the RF signal is less than the threshold, and to deactivate the first switch when the amplitude of the RF signal is greater than then threshold.

In an embodiment, the RF signal is configured to be a pulse-width modulated signal. The RF transmission system may also include a circulator coupled between the output of the amplifier and an output of the RF transmission system.

In an embodiment, the first transistor may be implemented by a first FET, and the second transistor may be implemented by a second FET. The first and second FETs may be MOSFETS implemented in a CMOS process, or may be FETs implemented in a Gallium Nitride process.

In accordance with a further embodiment, a method of operating an RF transmission system includes determining whether an amplitude of an RF signal is greater than an amplitude threshold. When the RF signal has an amplitude greater than the amplitude threshold, coupling the RF signal is coupled to a first transistor coupled in series with a cascode transistor; and when the RF signal has an amplitude less than the amplitude threshold, deactivating the first transistor is deactivated and the RF signal is coupled to the cascode transistor. The method further includes coupling an output of the cascode transistor to an output of the RF transmission system.

In embodiment, the method further includes decoupling the RF signal from the cascode transistor when the RF signal has an amplitude greater than the amplitude threshold. Furthermore, the step of deactivating the first transistor may include closing a switch coupled between an output node of the first transistor and a first reference voltage.

In an embodiment, the method further includes generating the RF signal by producing a pulse-width modulated signal. In some embodiments sideband energy may be limited using a circulator and a band pass filter coupled between the output of the cascode transistor and the output of the RF transmission system. The method may also include setting the amplitude threshold to produce a predetermined power efficiency of the RF transmission system when the RF signal has an amplitude of about the amplitude threshold.

An advantage of embodiments includes the ability to operate an amplifier at high efficiencies at low output levels.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
a first transistor comprising a first input node coupled to a first signal input, a first output node coupled to a first common node, and a first reference node coupled to a first reference voltage;
a second transistor comprising a second input node coupled to second signal input, a second output node coupled to an output of the system, and a second reference node coupled to the first common node;
a first switch switchably coupling the first common node to a second reference voltage;
a controller, wherein
the first switch comprises a control input coupled to the controller, wherein the first switch is configured to be open when the control input is in a first state, and the first switch is configured to be closed when the control input is in a second state; and
the controller is configured to
selectively couple a first signal to the first signal input when the control input is in the first state, and
couple the first signal to the second signal input when the control input is in the second state.

2. The system of claim 1, wherein the controller is further configured to decouple the first signal from the second signal input when the control input is in the first state.

3. The system of claim 1, wherein the controller is further configured to determine whether the control input is in the first state or in the second state.

4. The system of claim 3, wherein:
the controller is configured to set the control input in the first state when the first signal has an amplitude greater than a first amplitude threshold; and
the controller is configured to set the control input in the second state when the first signal has an amplitude less than the first amplitude threshold.

5. The system of claim 1, wherein the first signal comprises a pulse-width modulated signal.

6. A system comprising:
a first transistor comprising a first input node coupled to a first signal input, a first output node coupled to a first common node, and a first reference node coupled to a first reference voltage;
a second transistor comprising a second input node coupled to second signal input, a second output node coupled to an output of the system, and a second reference node coupled to the first common node;
a first switch switchably coupling the first common node to a second reference voltage;
a third transistor comprising a third input node coupled to a third signal input, a third output node coupled to the output of the system, and a third reference node coupled to the second output node of the second transistor; and
a second switch switchably coupling the third reference node of the third transistor to a third reference voltage.

7. The system of claim 1, wherein:
the first transistor comprises a first FET; and
the second transistor comprises a second FET.

8. The system of claim 7, wherein:
the first input node of the first transistor comprises a gate of the first FET;
the first output node of the first transistor comprises a drain of the first FET;
the first reference node of the first transistor comprises a source of the first FET;
the second input node of the first transistor comprises a gate of the second FET;
the second output node of the first transistor comprises a drain of the second FET; and
the second reference node of the first transistor comprises a source of the second FET.

9. A radio-frequency (RF) transmission system comprising:
a controllable signal source having a first RF signal output and a second RF signal output, the controllable signal source configured to provide an RF signal at the first RF signal output when an amplitude of the RF signal is greater than a threshold, and provide the RF signal at the second RF signal output when the amplitude of the RF signal is less than the threshold;
an amplifier comprising
a first transistor comprising a first input node coupled to the first RF signal output, a first output node coupled to a first common node, and a first reference node coupled to a first reference voltage,
a second transistor comprising a second input node coupled to the second RF signal output, a second output node coupled to an output of the amplifier, and a second reference node coupled to the first common node; and
a first switch switchably coupling the first common node to a second reference voltage.

10. The RF transmission system of claim 9, wherein the controllable signal source is further configured to prevent the RF signal from being provided at the second RF signal output when the amplitude of the RF signal is greater than the threshold.

11. The RF transmission system of claim 9, wherein:
the controllable signal source further comprises a controller; and
the first switch comprises a control input coupled to the controller, wherein the controller is configured to activate the first switch when the amplitude of the RF signal is less than the threshold, and to deactivate the first switch when the amplitude of the RF signal is greater than then threshold.

12. The RF transmission system of claim 9, wherein the RF signal is configured to be a pulse-width modulated signal.

13. The RF transmission system of claim 12, further comprising a circulator coupled between the output of the amplifier and an output of the RF transmission system.

14. The RF transmission system of claim 9, wherein the first transistor comprises a first FET, and the second transistor comprises a second FET.

15. The RF transmission system of claim 14, wherein the first FET and the second FET are MOSFETS.

16. The RF transmission system of claim 14, wherein the first FET and the second FET are implemented using a Gallium Nitride process.

17. A method of operating an RF transmission system, the method comprising:
determining whether an amplitude of an RF signal is greater than an amplitude threshold;
when the RF signal has an amplitude greater than the amplitude threshold, coupling the RF signal to a first transistor coupled in series with a cascode transistor;
when the RF signal has an amplitude less than the amplitude threshold, deactivating the first transistor and coupling the RF signal to the cascode transistor; and
coupling an output of the cascode transistor to an output of the RF transmission system.

18. The method of claim 17, further comprising decoupling the RF signal from the cascode transistor when the RF signal has an amplitude greater than the amplitude threshold.

19. The method of claim 17, wherein deactivating the first transistor comprises closing a switch coupled between an output node of the first transistor and a first reference voltage.

20. The method of claim 17, further comprising generating the RF signal, generating comprising producing a pulse-width modulated signal.

21. The method of claim 20, further comprising limiting sideband energy using a circulator and a band pass filter coupled between the output of the cascode transistor and the output of the RF transmission system.

22. The method of claim 17, further comprising setting the amplitude threshold to produce a predetermined power efficiency of the RF transmission system when the RF signal has an amplitude of about the amplitude threshold.

* * * * *